United States Patent
Kim et al.

(10) Patent No.: US 10,193,500 B2
(45) Date of Patent: Jan. 29, 2019

(54) SUPPLY MODULATOR AND COMMUNICATION DEVICE INCLUDING THE SAME

(71) Applicant: SAMSUNG ELECTRONICS CO., LTD., Suwon-si (KR)

(72) Inventors: Dong-su Kim, Suwon-si (KR); Ji-seon Paek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/613,705

(22) Filed: Jun. 5, 2017

(65) Prior Publication Data

US 2018/0123516 A1 May 3, 2018

(30) Foreign Application Priority Data

Nov. 2, 2016 (KR) .................. 10-2016-0145209

(51) Int. Cl.
*H04L 27/04* (2006.01)
*H03F 1/02* (2006.01)
*H03F 3/189* (2006.01)
*H03F 3/24* (2006.01)

(52) U.S. Cl.
CPC ............. *H03F 1/02* (2013.01); *H03F 3/189* (2013.01); *H03F 3/24* (2013.01); *H04L 27/04* (2013.01); *H03F 2200/102* (2013.01); *H03F 2200/105* (2013.01); *H03F 2200/451* (2013.01)

(58) Field of Classification Search
CPC ... H03F 1/02; H03F 3/189; H03F 3/24; H04L 27/04
See application file for complete search history.

(56) References Cited

U.S. PATENT DOCUMENTS

| 7,058,373 | B2 | 6/2006 | Grigore |
| 8,093,945 | B2 | 1/2012 | Wimpenny |
| 8,947,161 | B2 | 2/2015 | Khlat et al. |
| 2004/0127173 | A1* | 7/2004 | Leizerovich ......... H04B 1/0475 455/93 |
| 2005/0215209 | A1* | 9/2005 | Tanabe ................. H03F 1/0211 455/127.1 |
| 2008/0231115 | A1 | 9/2008 | Cho et al. |

(Continued)

OTHER PUBLICATIONS

Paek et al., "An RF-PA Supply Modulator Achieving 83% Efficiency and −136dBm/Hz Noise for LTE-40MHz and GSM 35dBm Applications", RF-to-THz Transceiver Techniques, Feb. 3, 2016, 3 pages total, Session 20, Samsung Electronics, IEEE, Hwaseong, Korea.

Diaz et al., "Three-Level Cell Topology for a Multilevel Power Supply to Achieve High Efficiency Envelope Amplifier", IEEE Transactions on Circuits and Systems-I: Regular Papers, Sep. 2012, 14 pages total, p. 2147-p. 2160, vol. 59, No. 9.

(Continued)

Primary Examiner — Jaison Joseph
(74) Attorney, Agent, or Firm — Sughrue Mion, PLLC

(57) ABSTRACT

A supply modulator includes: a voltage generator including output terminals respectively outputting voltages having different levels, and configured to select, in response to a selection control signal corresponding to an envelope signal, at least one of the voltages as a selection supply voltage and to generate the selection supply voltage by performing DC-DC conversion on a power supply voltage; and a switch unit configured to connect an output terminal through which the selection supply voltage is output to a power amplifier, in response to a connection control signal corresponding to the envelope signal.

17 Claims, 17 Drawing Sheets

(56) References Cited

U.S. PATENT DOCUMENTS

| | | | | |
|---|---|---|---|---|
| 2009/0004981 | A1* | 1/2009 | Eliezer | H03F 1/0211 |
| | | | | 455/127.1 |
| 2010/0074368 | A1* | 3/2010 | Karthaus | H03F 1/0222 |
| | | | | 375/296 |
| 2011/0163822 | A1* | 7/2011 | Yamanouchi | H03F 1/0227 |
| | | | | 332/145 |
| 2013/0176076 | A1 | 7/2013 | Riehl | |
| 2013/0229229 | A1* | 9/2013 | Park | H03F 1/0227 |
| | | | | 330/127 |
| 2014/0062590 | A1 | 3/2014 | Khlat et al. | |
| 2014/0285014 | A1* | 9/2014 | Calhoun | H02M 3/158 |
| | | | | 307/31 |
| 2015/0028834 | A1 | 1/2015 | Kuttner | |
| 2015/0311791 | A1* | 10/2015 | Tseng | H02M 3/158 |
| | | | | 323/271 |
| 2016/0094186 | A1 | 3/2016 | Cohen | |

OTHER PUBLICATIONS

Xi et al., "Feed-Forward Scheme Considering Bandwidth Limitation of Operational Amplifiers for Envelope Tracking Power Supply Using Series-Connected Composite Configuration", Sep. 2013, 12 pages total, vol. 60, No. 9, IEEE Transactions on Industrial Electronics.

Florian et al., "Envelope Tracking of an RF High Power Amplifier With an 8-Level Digitally Controlled GaN-on-Si Supply Modulator", Aug. 2015, 14 pages total, p. 2589-p. 2602, vol. 63, No. 8, IEEE Transactions on Microwave Theory and Techniques.

Kwon et al., "Single-Inductor Multiple-Output (SIMO) Switching DC-DC Converters", Mar. 21, 2009, 6 pages total, p. 1-p. 6, IEEE, Georgia, USA.

* cited by examiner

SUPPLY MODULATOR AND COMMUNICATION DEVICE INCLUDING THE SAME

CROSS-REFERENCE TO RELATED APPLICATION

This application claims priority from Korean Patent Application No. 10-2016-0145209, filed on Nov. 2, 2016, in the Korean Intellectual Property Office, the disclosure of which is incorporated herein in its entirety by reference.

BACKGROUND

Apparatuses and methods consistent with exemplary embodiments relate to a supply modulator, and more particularly, to a supply modulator generating a plurality of driving voltages having different levels and a communication device including the supply modulator.

Wireless communication devices such as smartphones, tablets, and Internet of Things (IoT) devices use WCDMA (3G), LTE, and LTE Advanced (4G) technology for high speed communication. As communication technology has been increasingly advancing, transmission or reception signals having a higher peak-to-average power ratio (PAPR) and a greater bandwidth are required. Thus, if a power supply of a power amplifier of a transmission end is connected to a battery, the efficiency of the power amplifier decreases. In order to increase the efficiency of a power amplifier having a high PAPR and a wide bandwidth, Average Power Tracking (APT) or Envelope Tracking (ET) is used. When using the ET technique, the efficiency and linearity of a power amplifier may be enhanced. A chip that supports the APT technique or ET technique is referred to as a supply modulator (SM).

SUMMARY

One or more exemplary embodiments provide a supply modulator that has a reduced circuit design area and uses less power during supply modulation, and a communication device including the supply modulator.

According to an aspect of an exemplary embodiment, there is provided a supply modulator including: a voltage generator, which includes a plurality of output terminals configured to respectively output voltages having different levels, and is configured to select, in response to a first selection control signal corresponding to a first envelope signal, at least one of the voltages as a first selection supply voltage and generate the first selection supply voltage by performing DC-DC conversion on a supply voltage input from a power supply; and a switch unit configured to connect an output terminal, of the plurality of output terminals, through which the first selection supply voltage is output to a first power amplifier, in response to a connection control signal corresponding to the first envelope signal.

According to an aspect of an exemplary embodiment, there is provided a communication device including: a modem configured to generate a transmission signal and an envelope signal corresponding to the transmission signal; a radio frequency (RF) signal generator configured to receive the transmission signal and generate an RF input signal based on the transmission signal; a supply modulator including voltage generation circuits respectively generating voltages having different levels, and configured to select one of the voltage generation circuits as a first selection voltage generation circuit based on the envelope signal at a first supply voltage selection timing, and generate a supply voltage by using the first selection voltage circuit; and a power amplifier configured to generate an RF output signal by amplifying the RF input signal based on the supply voltage.

According to an aspect of an exemplary embodiment, there is provided a supply modulator including: a voltage generator including: voltage generation circuits, each of the voltage generating circuits configured to generate a supply voltage of a different level based on respective envelope signals of received transmission signals, and output terminals, each of the output terminals connected to a respective voltage generating circuit to output the generated supply voltage; and a switch unit including switches, each of the switches configured to connect a power amplifier to a respective output terminal and provide, to the power amplifier, a supply of the generated supply voltage from the respective voltage generating circuit in correspondence to the respective envelope signals.

DETAILED DESCRIPTION OF EXEMPLARY EMBODIMENTS

Figure 1:
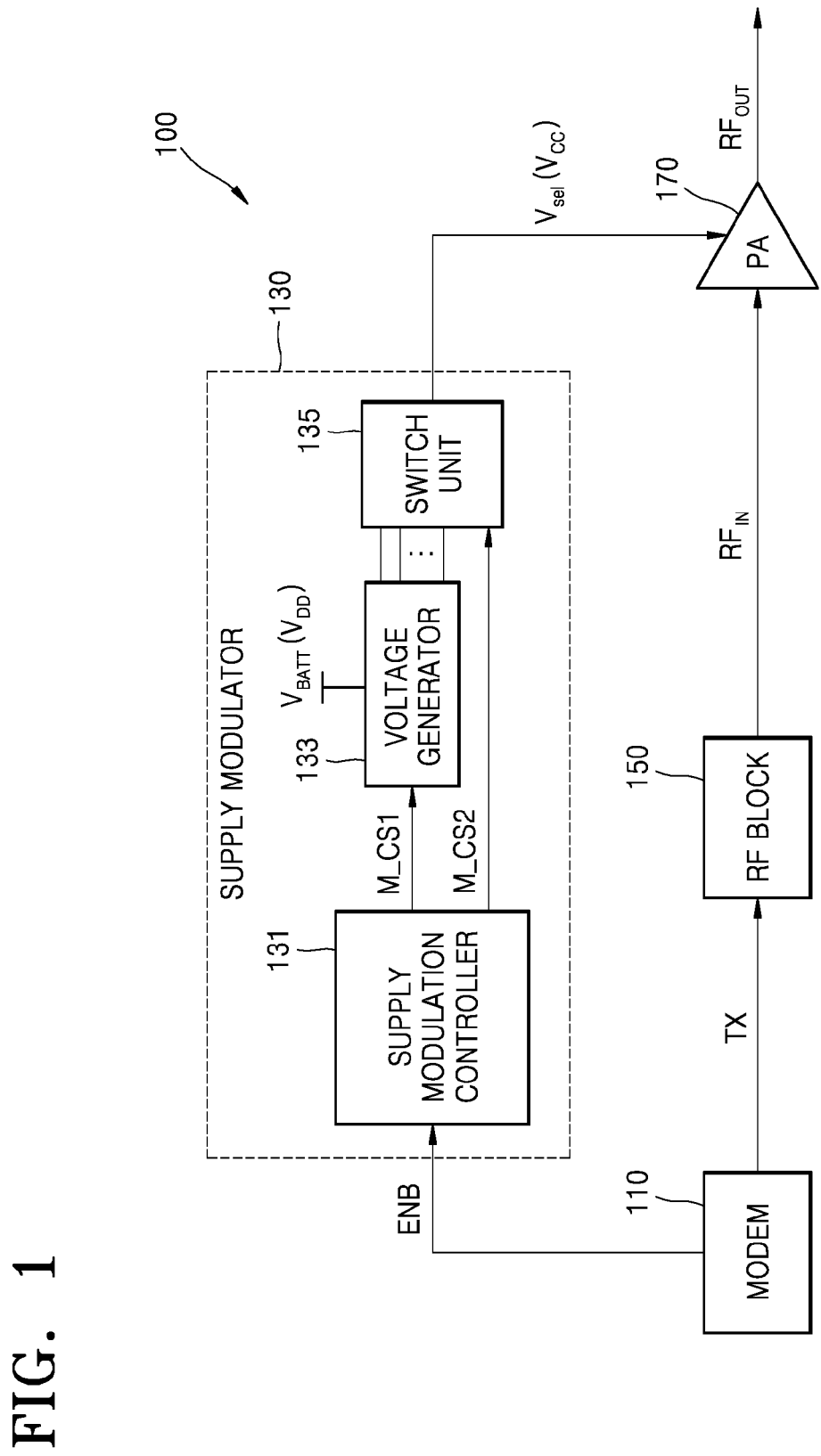
FIG. 1 is a schematic block diagram of a communication device according to an example embodiment.

Referring to FIG. 1, the communication device 100 may include a modem 110, a supply modulator 130, an RF block 150, e.g., an RF signal generator, and a power amplifier (PA) 170. The modem 110 may process baseband signals transmitted or received by the communication device. The modem 110 may generate a digital signal, and generate, from the digital signal, a digital transmission signal and a digital envelope signal corresponding to the digital transmission signal. The digital envelope signal may be generated from an amplitude component of the digital transmission signal. The modem 110 may perform digital-to-analog conversion on the digital transmission signal and the digital envelope signal and provide a transmission signal TX and an envelope signal ENB to the RF block 150 and the supply modulator 130, respectively. However, the envelope signal ENB provided by the modem 110 to the supply modulator 130 is not limited to analog signals, and may also be digital signals.

The supply modulator 130 may modulate a voltage level of a supply voltage Vcc to be provided to the PA 170, based on the envelope signal ENB. The supply modulator 130 may include a supply modulation controller 131, a voltage generator 133, and a switch unit 135. While the supply modulation controller 131 is illustrated as being included in the supply modulator 130, the example embodiments are not limited thereto; the supply modulation controller 131 may be included in the modem 110 or implemented as a separate component. According to the present example embodiment, the supply modulation controller 131 may generate modulation control signals, e.g., a selection control signal M_CS1 and a connection control signal M_CS2, based on the envelope signal ENB received from the modem 110, and provide the modulation control signals M_CS1 and M_CS2 to the voltage generator 133 and the switch unit 135. In an example embodiment, the supply modulation controller 131 may generate modulation control signals M_CS1 and M_CS2 at each period of selecting a supply voltage to be provided to the PA 170, that is, at each supply voltage select period, based on the envelope signal ENB, and provide the same to the voltage generator 133 and the switch unit 135. The supply modulation controller 131 may set a supply voltage select period based on a size of a frequency bandwidth of an analog transmission signal TX or an RF signal $RF_{IN}$ corresponding to the envelope signal ENB. For example, the supply modulation controller 131 may set a shorter supply voltage select period, as the size of the frequency bandwidth of the RF signal $RF_{IN}$ corresponding to the envelope signal ENB increases. The supply modulation controller 131 may set a minimum level difference between selection supply voltages generated at each supply voltage select period based on a frequency bandwidth size of the analog transmission signal TX or the RF signal $RF_{IN}$ corresponding to the envelope signal ENB. For example, the supply modulation controller 131 may set a smaller minimum level difference between selection supply voltages, as the size of the frequency bandwidth of the RF signal $RF_{IN}$ corresponding to the envelope signal ENB increases.

The voltage generator 133 may generate a plurality of voltages having different levels by using a battery voltage $V_{BATT}$, i.e., a power voltage or an input supply voltage $V_{DD}$. In response to a selection control signal M_CS1 received from the supply modulation controller 131, the voltage generator 133 may select at least one of a plurality of voltages that may be generated by the voltage generator 133, as a selection supply voltage Vsel, and perform DC-DC conversion on the power voltage $V_{DD}$ to generate only the selection supply voltage Vsel. For example, only a circuit or a block in the voltage generator 133 generating the selection supply voltage Vsel may be enabled via the selection control signal M_CS1.

The voltage generator 133 may include a plurality of output terminals respectively outputting a plurality of voltages, and the plurality of output terminals may be connected to the switch unit 135. The switch unit 135 may include a plurality of switching devices, and in response to a connection control signal M_CS2 received from the supply modulation controller 131, the switch unit 135 may connect an output terminal through which a selection supply voltage Vsel is output, among a plurality of output terminals of the voltage generator 133, to the PA 170 via a switching operation. According to an example embodiment, the voltage generator 133 may include an SIMO converter. According to another example embodiment, the voltage generator 133 may include a plurality of DC-DC converters respectively generating a plurality of voltages.

The RF block 150 may perform up-conversion on the analog transmission signal TX to generate an RF signal $RF_{IN}$. The PA 170 may be operated via the selection supply voltage Vsel, and amplify power of the RF signal $RF_{IN}$ to generate an RF output signal $RF_{OUT}$. The RF output signal $RF_{OUT}$ may be provided to an antenna.

According to the present example embodiment, the supply modulator 130 may select at least one of the plurality of voltages, as a selection supply voltage Vsel, and provide the selection supply voltage Vsel to the PA 170, thereby modulating a voltage level of a supply voltage to be provided to the PA 170 adaptively with respect to the envelope signal ENB. In detail, if the envelope signal ENB has a relatively low level, the supply modulator 130 may supply a relatively low voltage as the selection supply voltage Vsel and provide the same to the PA 170, and if the envelope signal ENB has a relatively high level, the supply modulator 130 may supply a relatively high voltage as the selection supply voltage Vsel to the PA 170. Accordingly, the supply modulator 130 may enhance efficiency in terms of power consumption, and increase a battery usage period. A technique of adaptively modulating a voltage level of a supply voltage based on an envelope signal ENB is referred to as Envelope Tracking (ET).

Furthermore, the supply modulator 130 may perform an Average Power Tracking (APT) operation in which a voltage level of a supply voltage is modulated based on a highest voltage of an envelope signal ENB during each predetermined transmission time interval (TTI) based on the envelope signal ENB. The supply modulator 130 may selectively perform an APT operation or an ET operation based on a signal transmission power set to a communication device including the supply modulator 130. Hereinafter, description will focus on the supply modulator 130 performing an ET operation, but an exemplary embodiment is applicable to an APT operation.

The supply modulator 130 may be implemented as a SIMO converter and thus may reduce a circuit design area of the supply modulator 130. The supply modulator 130 may generate only a selection supply voltage Vsel, thereby reducing power consumption during a supply modulation operation.

Figure 2:
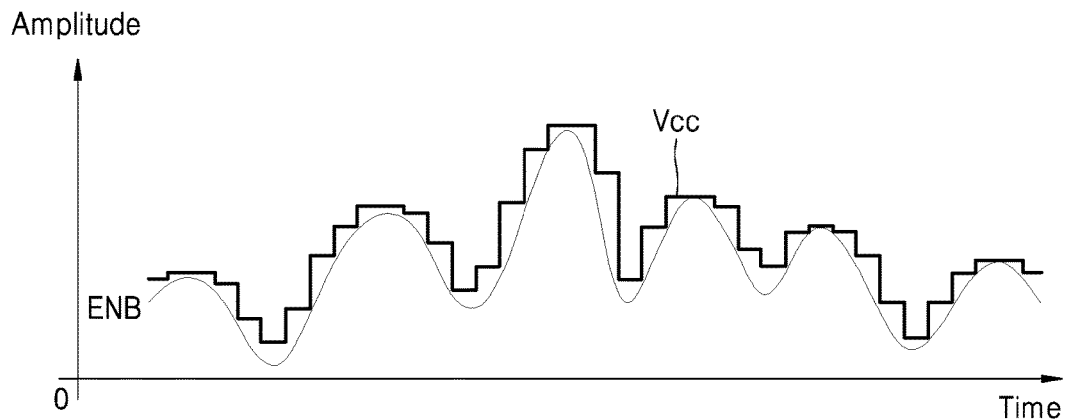
FIG. 2 is a graph for explaining an operation of a supply modulator of FIG. 1.

Referring to FIG. 2, the supply modulator 130 may modulate a supply voltage $V_{CC}$ to be provided to a power amplifier, based on an envelope signal ENB by using DC voltages having different levels. The supply voltage $V_{CC}$ provided to the power amplifier may be a bias voltage.

Figure 3:
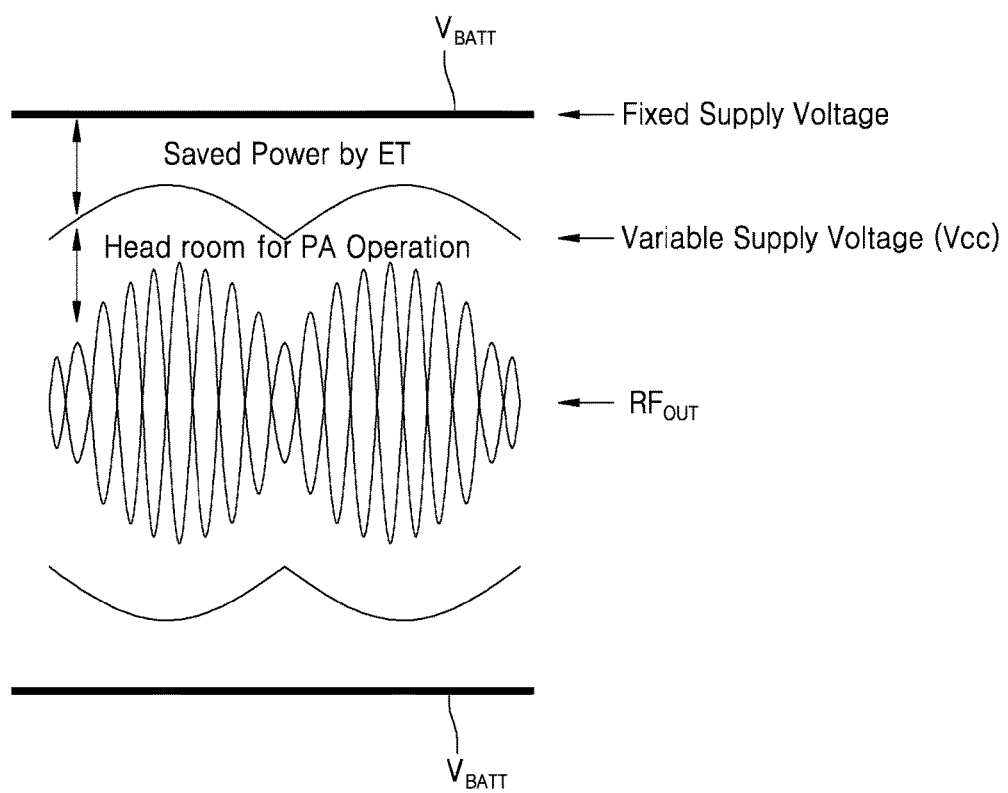
FIG. 3 is a graph for explaining an operation of a power amplifier of FIG. 1.

Referring to FIG. 3, if envelope tracking is not applied to the communication device 100, but constant power, for example, a battery voltage $V_{BATT}$, is provided to the PA 170, a voltage difference between an RF output signal $RF_{OUT}$ and the constant power may be relatively great. The voltage difference may decrease the battery lifespan and turn as energy loss which may increase heat generated in the communication device 100.

The communication device 100 according to the present example embodiment may use the ET technique or the APT technique to provide a variable supply voltage $V_{CC}$ to the power amplifier. Accordingly, by reducing a voltage difference between the RF output signal $RF_{OUT}$ and the variable supply voltage $V_{CC}$, energy waste may be minimized and the battery lifespan may be increased.

Figure 4:
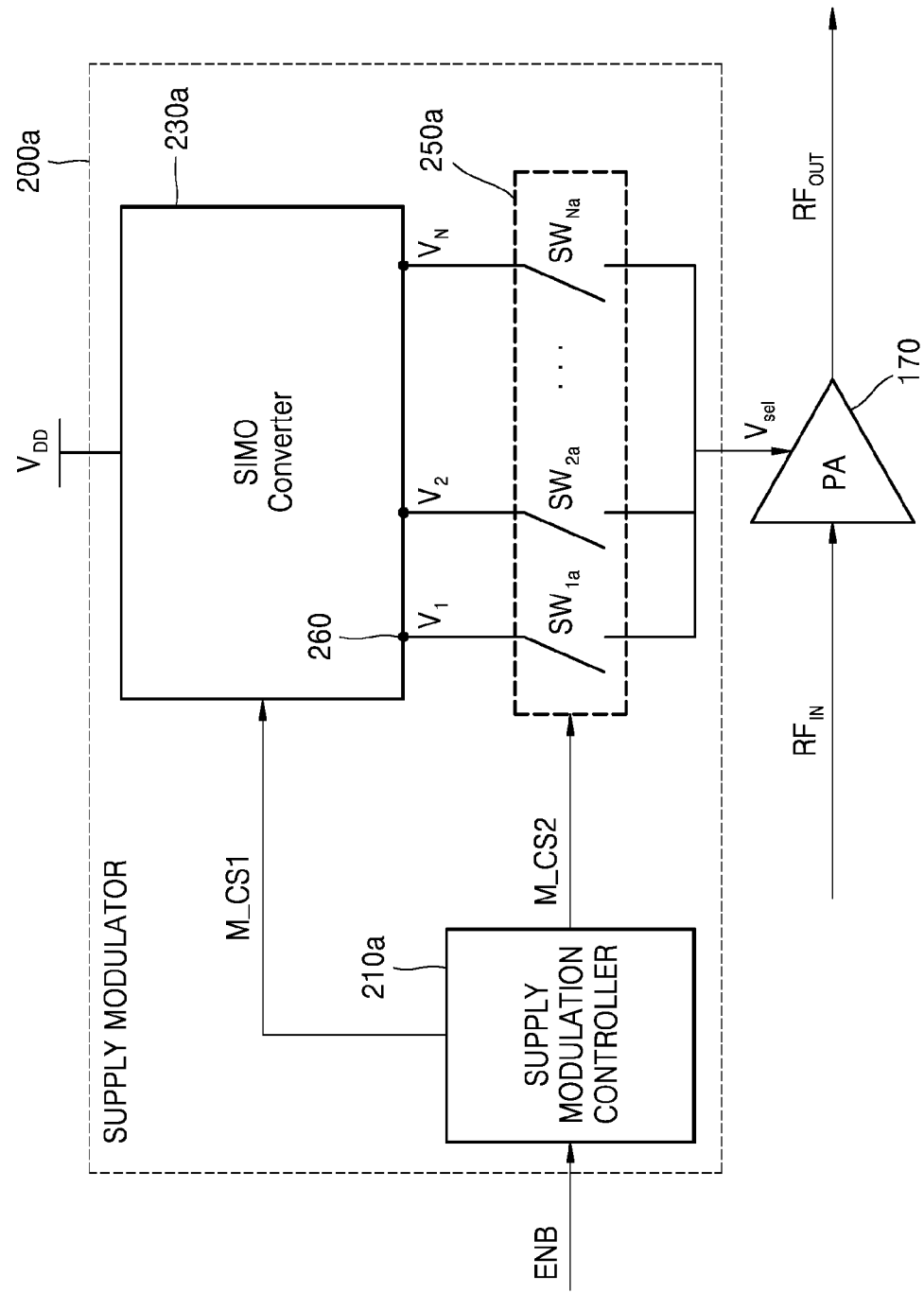
FIG. 4 is a block diagram of a supply modulator according to an example embodiment.

Referring to FIG. 4, the supply modulator 200a may correspond to the supply modulator 130 and may include a supply modulation controller 210a, a SIMO converter 230a, and a switch unit 250a. The supply modulation controller 210a may receive an envelope signal ENB from the outside, generate a selection control signal M_CS1 based on the envelope signal ENB and provide the same to the SIMO converter 230a, and generate a connection control signal M_CS2 and provide the same to the switch unit 250a. The supply modulation controller 210a may generate a selection control signal M_CS1 and a connection control signal M_CS2 at each supply voltage select period.

The SIMO converter 230a may include a plurality of voltage generation circuits that may generate a plurality of voltages $V_1$ through $V_N$ having predetermined uniform DC levels that are different from one another. In response to the selection control signal M_CS1, the SIMO converter 230a may select at least one of the plurality of voltages $V_1$ through $V_N$ as a selection supply voltage to generate the selection supply voltage. According to an example embodiment, among the plurality of voltage generation circuits of the SIMO converter 230a, only a voltage generation circuit that generates a selection supply voltage in response to the selection control signal M_CS1 may be enabled, and the other voltage generation circuits may be disabled. However, this is exemplary, and among the plurality of voltage generation circuits of the SIMO converter 230a, a voltage generation circuit that generates a selection supply voltage in response to the selection control signal M_CS1 and a voltage generation circuit that is set to generate a next selection supply voltage may be enabled to thereby secure a time needed for modulating a supply voltage $V_{DD}$. For example, after a first voltage $V_1$ is supplied to a PA 170 as a selection supply voltage Vsel, when a second voltage $V_2$ is set to be supplied immediately thereafter to the PA 170 as another selection supply voltage Vsel, a first voltage generation circuit generating the first voltage $V_1$ in response to the selection control signal M_CS1 and a second voltage generation circuit generating the second voltage $V_2$ may be enabled, and the other voltage generation circuits may be disabled.

The switch unit 250a may include a plurality of switching devices $SW_{1a}$ and $SW_{2a}$ through $SW_{Na}$, e.g., switches. The switching devices $SW_{1a}$ through $SW_{Na}$ of the switch unit 250a may be respectively connected to output terminals 260 of the SIMO converter 230a outputting a plurality of voltages $V_1$ through $V_N$ on a one-to-one basis. The switch unit 250a may, in response to the connection control signal M_CS2, connect an output terminal of the SIMO converter 230a outputting a selection supply voltage Vsel and the PA 170 to each other.

Figure 5:
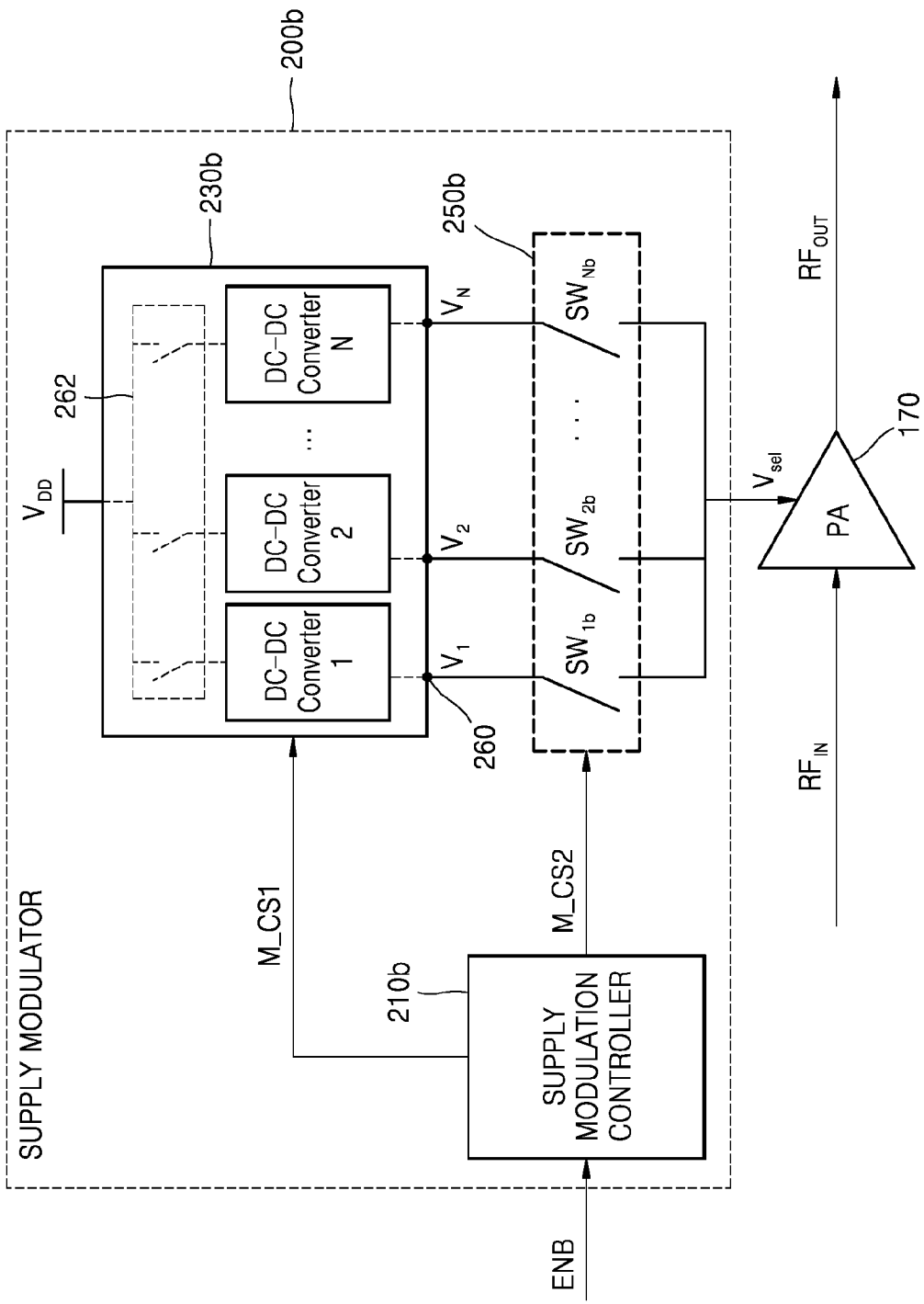
FIG. 5 is a block diagram of a supply modulator according to another example embodiment.

Referring to FIG. 5, the supply modulator 200b may correspond to the supply modulator 130 and may include a supply modulation controller 210b, a plurality of DC-DC converters 230b generating voltages of different levels, and a switch unit 250b. Hereinafter, description will focus on an operation of the supply modulator 200b that differs from that of FIG. 4. In response to a selection control signal M_CS1, the plurality of DC-DC converters 1 through N may select at least one of a plurality of voltages $V_1$ through $V_N$ as a selection supply voltage to generate the selection supply voltage. According to an example embodiment, only those DC-DC converters that generate a selection supply voltage in response to a selection control signal M_CS1 may be enabled among the plurality of DC-DC converters 230b, and the other DC-DC converters may be disabled. For example, when an Nth voltage $V_N$ is selected as a selection supply voltage Vsel, the DC-DC converters 1 through N-1 may be disabled, and the DC-DC converter N may be enabled via the selection control signal M_CS1. In an example embodiment, each of the DC-DC converters 1 through N may be connected to a power voltage $V_{DD}$ via a switch device 262 including switches, and a switch between an enabled DC-DC converter and the power voltage $V_{DD}$ may be turned on, and a switch between a disabled DC-DC converter and the power voltage $V_{DD}$ may be turned off.

In another example embodiment, a DC-DC converter generating a selection supply voltage in response to a selection control signal M_CS1 and at least one other DC-DC converter that is set to generate a next selection supply voltage may be enabled.

The switch unit 250b may include a plurality of switch devices $SW_{1b}$ and $SW_{2b}$ through $SW_{Nb}$, and each of the switch devices $SW_{1b}$ through $SW_{Nb}$ may be connected to the DC-DC converters 230b on a one-to-one basis. In response to a connection control signal M_CS2, the switch unit 250b may connect a DC-DC converter outputting a selection supply voltage Vsel to a PA 170. Hereinafter, description will focus on a supply modulator including a SIMO converter.

Figure 6:
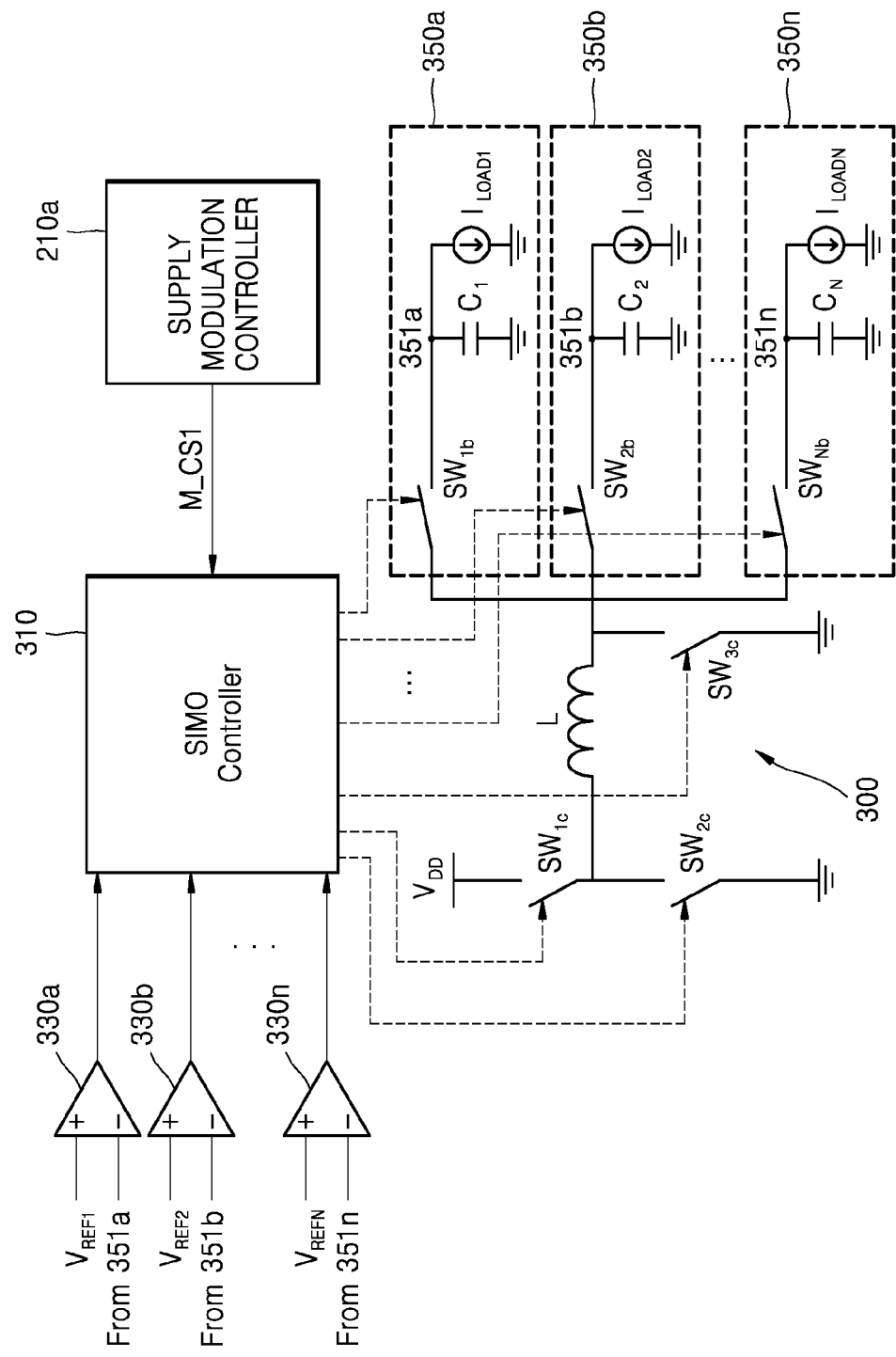
FIG. 6 is a diagram illustrating a Single Inductor Multiple Output (SIMO) converter included in a supply modulator according to an example embodiment.

Referring to FIG. 6, the SIMO converter 300 included in a supply modulator may include a SIMO controller 310, a plurality of comparators 330a and 330b through 330n, a plurality of voltage generation circuits 350a through 350n, an inductor L, and switch devices $SW_{1c}$, $SW_{2c}$, and $SW_{3c}$. The SIMO converter 300 may generate a plurality of voltages of different levels, and output the voltages through respective output terminals 351a through 351n of the voltage generation circuits 350a through 350n.

The voltage generation circuits 350a through 350n may respectively include switch devices $SW_{1b}$ through $SW_{Nb}$, capacitors $C_1$ through $C_N$, loads $I_{LOAD1}$ through $I_{LOADN}$, and output terminals 351a and 351b through 351n. In an example embodiment, the voltage generation circuits 350a through 350n may respectively include capacitors having different capacitances and different loads. The comparators 330a through 330n may respectively receive reference voltages $V_{REF1}$ and $V_{REF2}$ through $V_{REFN}$ and a feedback signal from the output terminals 351a through 351n of the voltage generation circuits 350a through 350n to generate a control signal and provide the control signal the SIMO controller 310. The SIMO controller 310 may control, by using control signals received from the plurality of comparators 330a through 330n, the switch devices $SW_{1c}$, $SW_{2c}$, and $SW_{3c}$ connected to an end of the inductor L and the switch devices $SW_{1b}$ through $SW_{Nb}$ of the voltage generation circuits 350a through 350n, to thereby generate voltages $V_1$ through $V_N$ of different levels.

Referring to FIGS. 4 and 6, according to an example embodiment, a supply modulation controller 210a may generate a selection control signal M_CS1 based on an envelope signal and provide the same to the SIMO converter 300. In response to the selection control signal M_CS1, the SIMO controller 310 may select one of the plurality of voltages $V_1$ through $V_N$ as a selection supply voltage. For example, the SIMO controller 310 may select a first voltage $V_1$ as a selection supply voltage in response to the selection control signal M_CS1. When assuming that the first voltage $V_1$ is generated from the first voltage generation circuit 350a, the SIMO controller 310 may enable the first voltage generation circuit 350a to turn on or off the switching device $SW_{1b}$ of the first voltage generation circuit 350a so that the first voltage generation circuit 350a generates the first voltage $V_1$. The SIMO controller 310 may keep the switch devices $SW_{2b}$ through $SW_{Nb}$ of the other voltage generation circuits 350b through 350n to be in an off state so that the voltage generation circuits 350b through 350n are disabled. The switch unit 250a may connect, in response to a connection control signal M_CS2, an output terminal 351a of the first voltage generation circuit 350a and a PA 170 and provide the first voltage $V_1$ to the PA 170 as a selection supply voltage Vsel.

As described above, as only one inductor L is needed to generate a plurality of voltages by using a supply modulator including the SIMO converter 300, a circuit design area for the supply modulator may be reduced, and power consumption during a supply modulation operation may be reduced by controlling the SIMO converter 300 such that only a selection supply voltage is generated using the SIMO converter 300.

Figure 7A:
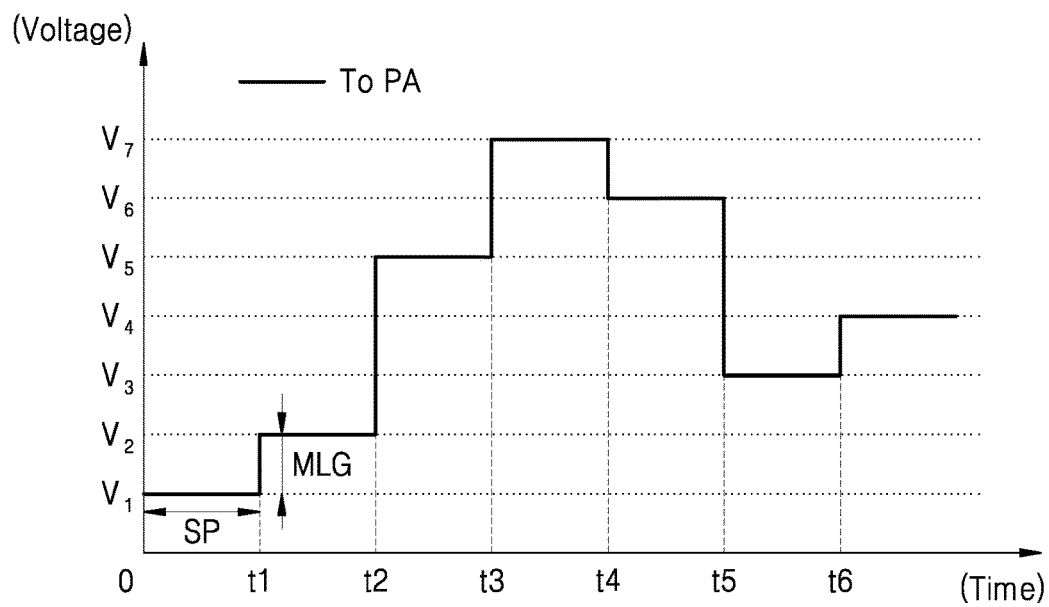
FIGS. 7A, 7B, and 7C are graphs illustrating a supply modulation operation of the supply modulator, according to an example embodiment.
Figure 7B:
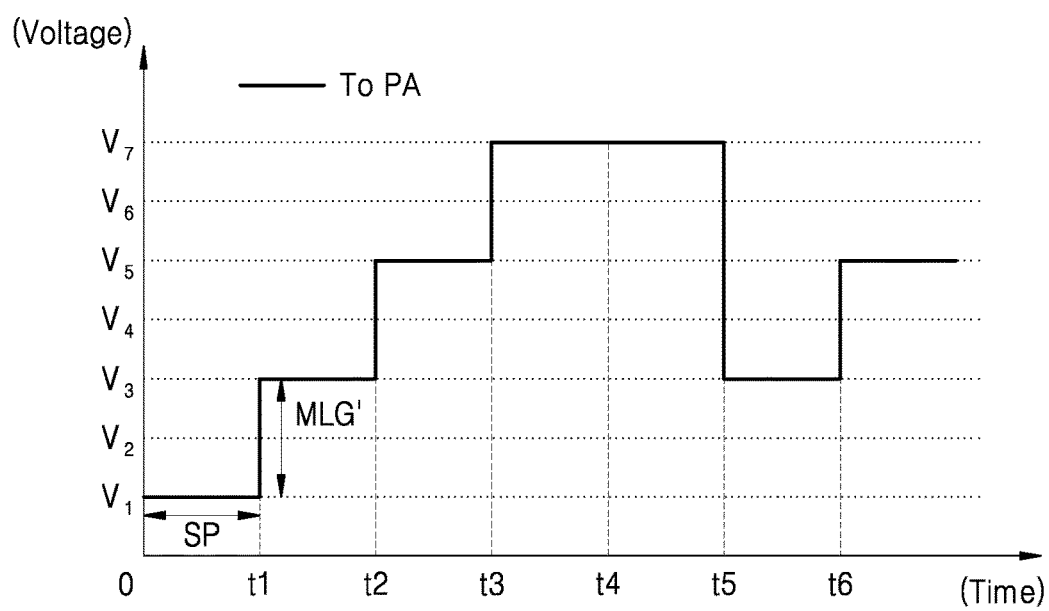
Figure 7C:
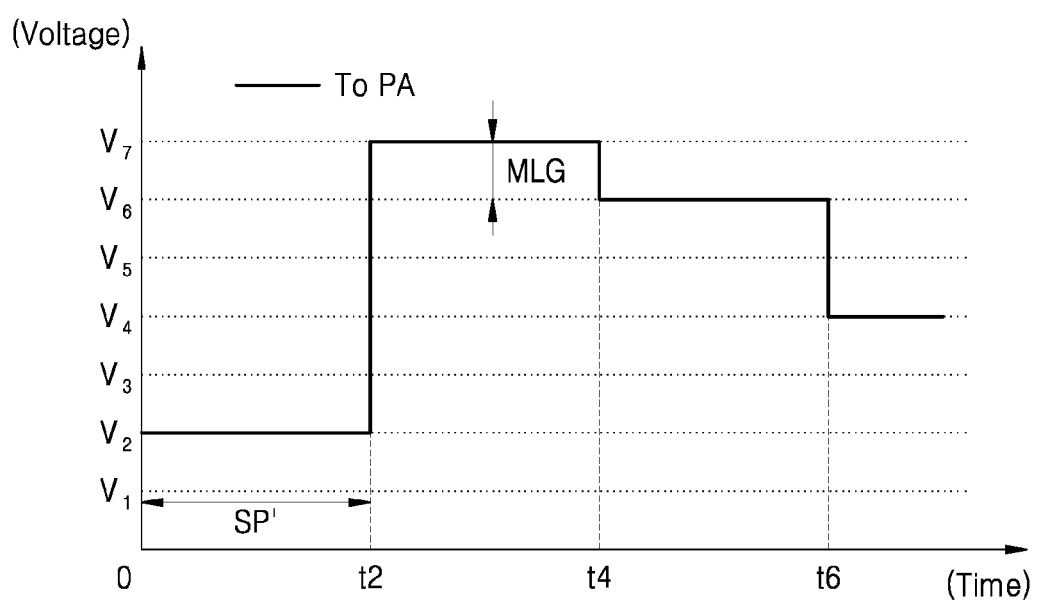

FIGS. 7A through 7C are graphs illustrating a supply modulation operation of the supply modulator by referring as an example to the supply modulator 200a of FIG. 4 for the convenience of the description. Hereinafter, the SIMO converter 230a of FIG. 4 will be assumed to be able to generate voltages having seven different levels (it is assumed that N=7).

Referring to FIGS. 4 and 7A, in a section 0-t1, the supply modulator 200a may provide a first voltage $V_1$ to the PA 170 as a selection supply voltage Vsel. In a section t1-t2, the supply modulator 200a may provide a second voltage $V_2$ to the PA 170 as a selection supply voltage Vsel. In a section t2-t3, the supply modulator 200a may provide a fifth voltage $V_5$ to the PA 170 as a selection supply voltage Vsel. In a section t3-t4, the supply modulator 200a may provide a seventh voltage $V_7$ to the PA 170 as a selection supply voltage Vsel. In a section t4-t5, the supply modulator 200a may provide a sixth voltage $V_6$ to the PA 170 as a selection supply voltage Vsel. In a section t5-t6, the supply modulator 200a may provide a third voltage $V_3$ to the PA 170 as a selection supply voltage Vsel. Each section may have the same length, and each of the first through seventh voltages $V_1$ through $V_7$ may differ by a predetermined unit level.

The supply modulation controller 210a may set a supply voltage select period SP and a minimum level gap MLG between selection supply voltages Vsel based on an envelope signal ENB corresponding to an RF signal $RF_{IN}$. For example, the supply modulation controller 210a may set a shorter supply voltage select period SP and a smaller minimum level gap MLG as a frequency bandwidth of the RF signal $RF_{IN}$ increases to thereby control a more delicate envelope tracking operation. Information regarding the frequency bandwidth of the RF signal $RF_{IN}$ may be included in the envelope signal ENB. However, the information, based on which the supply modulation controller 210a sets the supply voltage select period SP and the minimum level gap MLG, is not limited to a frequency bandwidth of the RF signal $RF_{IN}$, and various information such as a data amount to be transmitted through the RF signal $RF_{IN}$ may also be used.

The supply modulation controller 210a may set a supply voltage select period SP corresponding to a length of a section in which a selection supply voltage Vsel is supplied to the PA 170. The supply modulation controller 210a may generate a selection control signal M_CS1 based on an envelope signal ENB for each supply voltage select period SP and provide the selection control signal M_CS1 to the SIMO converter 230a, and generate a connection control signal M_CS2 based on the envelope signal ENB for each supply voltage select period SP and provide the same to the switch unit 250a. The supply modulation controller 210a may set a minimum level gap MLG between selection supply voltages Vsel generated in each supply voltage select period SP. For example, as illustrated in FIG. 7A, the supply modulation controller 210a may set a minimum level gap MLG corresponding to one unit level.

Referring to FIG. 7B, the supply modulation controller 210a may set a minimum level gap MLG' between selection supply voltages Vsel, which corresponds to two unit levels, based on a frequency bandwidth of a RF signal $RF_{IN}$.

Referring to FIG. 7C, the supply modulation controller 210a may set a longer supply voltage select period SP', based on a frequency bandwidth of the RF signal $RF_{IN}$. For example, the supply modulation controller 210a may set a supply voltage select period SP' corresponding to a length of the section 0-t2.

As described above, by setting various minimum level gaps between selection supply voltages and various supply voltage select periods, the supply modulation controller 210a may control an envelope tracking operation of a supply modulator in various manners.

Figure 8:
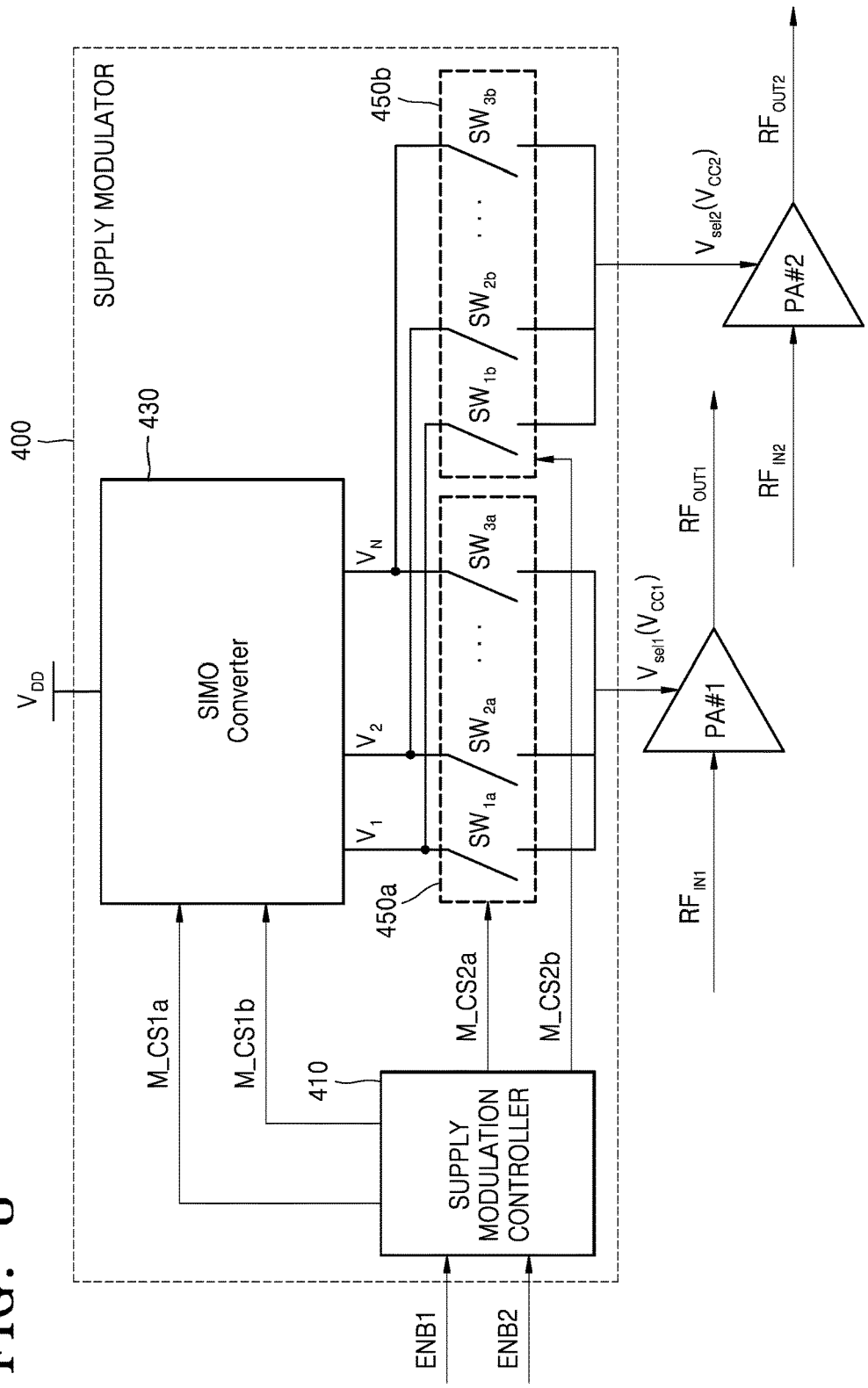
FIG. 8 is a block diagram illustrating a supply modulator for providing a selection supply voltage to power amplifiers, according to an example embodiment.

FIG. 8 is a block diagram illustrating a supply modulator 400 for providing a selection supply voltage to a plurality of power amplifiers, according to an example embodiment. Referring to FIG. 8, the supply modulator 400 may include a supply modulation controller 410, a SIMO converter 430, a first switch unit 450a and a second switch unit 450b. The supply modulation controller 410 may receive a first envelope signal ENB1 from the outside, and generate a first selection control signal M_CS1a based on the first envelope signal ENB1 and provide the same to the SIMO converter 430, and generate a first connection control signal M_CS2a and provide the same to the first switch unit 450a. Accordingly, in response to the first selection control signal M_CS1a, the SIMO converter 430 may select at least one of a plurality of voltages $V_1$ through $V_N$ as a first selection supply voltage $V_{sel1}$, and the first switch unit 450a may perform a switching operation so as to supply the first selection supply voltage $V_{sel1}$ to a first power amplifier PA#1 as a supply voltage $V_{CC1}$ based on the first connection control signal M_CS2a. The supply modulation controller 410 may receive a second envelope signal ENB2 from the outside, and generate a second selection control signal M_CS1b based on the second envelope signal ENB2 and provide the same to the SIMO converter 430, and generate a second connection control signal M_CS2b and provide the same to the second switch unit 450b. Accordingly, in response to the second selection control signal M_CS1b, the SIMO converter 430 may select at least one of the plurality of voltages $V_1$ through $V_N$ as a second selection supply voltage $V_{se12}$, and the second switch unit 450b may perform a switching operation so as to supply the second selection supply voltage $V_{se12}$ to a second power amplifier PA#2 as a supply voltage $V_{CC2}$ based on the second connection control signal M_CS2b.

According to an example embodiment, the first power amplifier PA#1 may amplify a first RF signal $RF_{IN1}$ to a first RF output signal $RF_{OUT1}$ based on the supply voltage Vcc1 received from the supply modulator 400. The second power amplifier PA#2 may amplify a second RF signal $RF_{IN2}$ to a second RF output signal $RF_{OUT2}$ based on the supply voltage $V_{CC2}$ received from the supply modulator 400. The communication device according to an exemplary embodiment may include the first power amplifier PA#1 and the second power amplifier PA#2, and the communication device may perform a carrier aggregation (CA) operation by using the first power amplifier PA#1 and the second power amplifier PA#2.

Here, a frequency bandwidth of the first RF signal $RF_{IN1}$ received by the first power amplifier PA#1 and a frequency bandwidth of the second RF signal $RF_{IN2}$ received by the second power amplifier PA#2 may be identical or different according to operating conditions of carrier aggregation. According to an example embodiment, when a frequency bandwidth of the first RF signal $RF_{IN1}$ and a frequency bandwidth of the second RF signal $RF_{IN2}$ are different, the supply modulation controller 410 may control an envelope tracking operation on the first power amplifier PA#1 of the supply modulator 400 and an envelope tracking operation on the second power amplifier PA#2 of the supply modulator 400 differently. For example, when a frequency bandwidth of the first RF signal $RF_{IN1}$ is greater than a frequency bandwidth of the second RF signal $RF_{IN2}$, the supply modulation controller 410 may set a minimum level gap MLG between first selection voltage levels $V_{sel1}$ provided to the first power amplifier PA#1 to be smaller than a minimum level gap MLG between second selection voltage levels $V_{se12}$ provided to the second power amplifier PA#2. The supply modulation controller 410 may set a supply voltage select period based on a signal having a greater frequency bandwidth among the first RF signal $RF_{IN1}$ and the second RF signal $RF_{IN2}$. The supply modulation controller 410 may generate first and second selection control signals M_CS1a and M_CS1b and first and second connection control signals M_CS2a and M_CS2b for each supply voltage select period, and provide the same to each of the SIMO converter 430 and the first and second switch units 450a and 450b.

Figure 9:
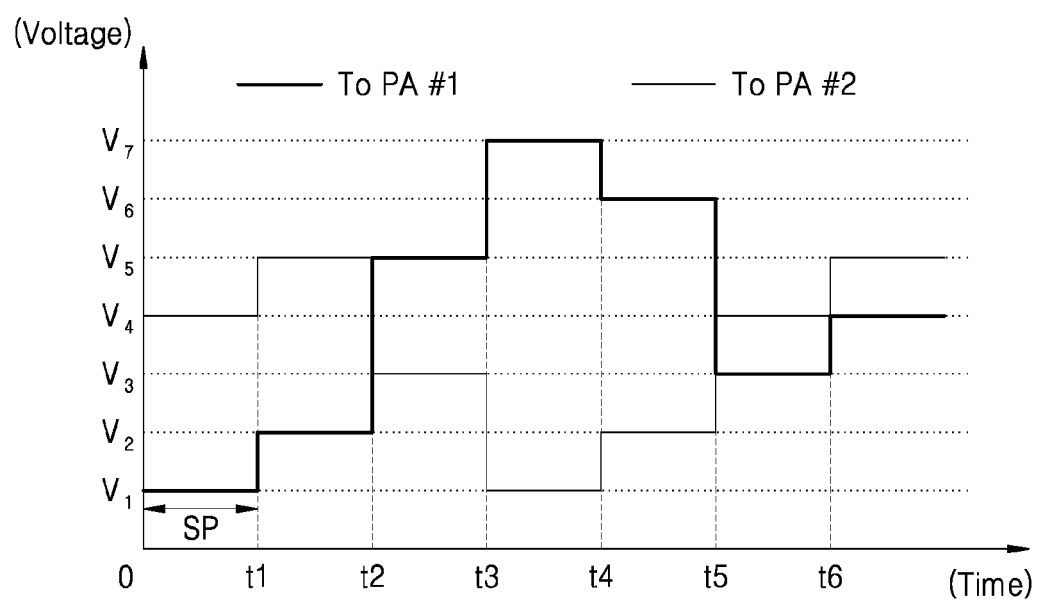
FIG. 9 is a graph illustrating a supply modulation operation of the supply modulator, according to another example embodiment.

FIG. 9 is a graph illustrating an operation of a supply modulation operation of the supply modulator 400 of FIG. 8 according to an example embodiment. Hereinafter, the SIMO converter 430 of FIG. 8 will be assumed to be able to generate voltages having seven different levels (it is assumed that N=7).

Referring to FIGS. 8 and 9, in a section 0-t1, the supply modulator 400 may provide a first voltage $V_1$ to the first power amplifier PA#1 as a first selection supply voltage $V_{sel1}$, and a fourth voltage $V_4$ to the second power amplifier PA#2 as a second selection supply voltage $V_{se12}$. In a section t1-t2, the supply modulator 400 may provide a second voltage $V_2$ to the first power amplifier PA#1 as a selection supply voltage $V_{sel1}$, and a fifth voltage $V_5$ to the second power amplifier PA#2 as a second selection supply voltage $V_{se12}$. In a section t2-t3, the supply modulator 400 may provide a fifth voltage $V_5$ as a first selection supply voltage $V_{sel1}$ to the first power amplifier PA#1 as a first selection supply voltage $V_{sel1}$, and a third voltage $V_3$ to the second power amplifier PA#2 as a second selection supply voltage $V_{se12}$. In a section t3-t4, the supply modulator 400 may provide a seventh voltage $V_7$ to the first power amplifier PA#1 as a selection supply voltage $V_{sel1}$ and a first voltage $V_1$ to the second power amplifier PA#2 as a second selection supply voltage $V_{se12}$. In a section t4-t5, the supply modulator 400 may provide a sixth voltage $V_6$ to the first power amplifier PA#1 as a first selection supply voltage $V_{sel1}$ and a second voltage $V_2$ to the second power amplifier PA#2 as a second selection supply voltage $V_{se12}$. In a section t5-t6, the supply modulator 400 may provide a third voltage $V_3$ to the first power amplifier PA#1 as a first selection supply voltage $V_{sel1}$ and a fourth voltage $V_4$ to the second power amplifier PA#2 as a second selection supply voltage $V_{se12}$. Each section may have the same length, and each of the first through seventh voltages $V_1$ through $V_7$ may differ by a predetermined unit level.

According to an example embodiment, among the plurality of voltage generation circuits of the supply modulator 400, only the voltage generation circuits generating a first selection supply voltage $V_{sel1}$ and a second selection supply voltage $V_{se12}$ may be enabled in response to the first and second selection control signals M_CS1a and M_CS1b, and the other voltage generation circuits may be disabled. For example, a voltage generation circuit generating the first voltage $V_1$ and a voltage generation circuit generating the fourth voltage $V_4$ in the section t0-t1 may be enabled in response to the first and second selection control signals M_CS1a and M_CS1b, and the other voltage generation circuits may be disabled.

That is, the supply modulation controller 410 may control the plurality of voltage generation circuits of the supply modulator 400 such that only those voltage generation circuits generating a selection supply voltage to be provided to a plurality of power amplifiers are enabled. Accordingly, power consumption during an envelope tracking operation of the supply modulator 400 may be reduced.

Figure 10:
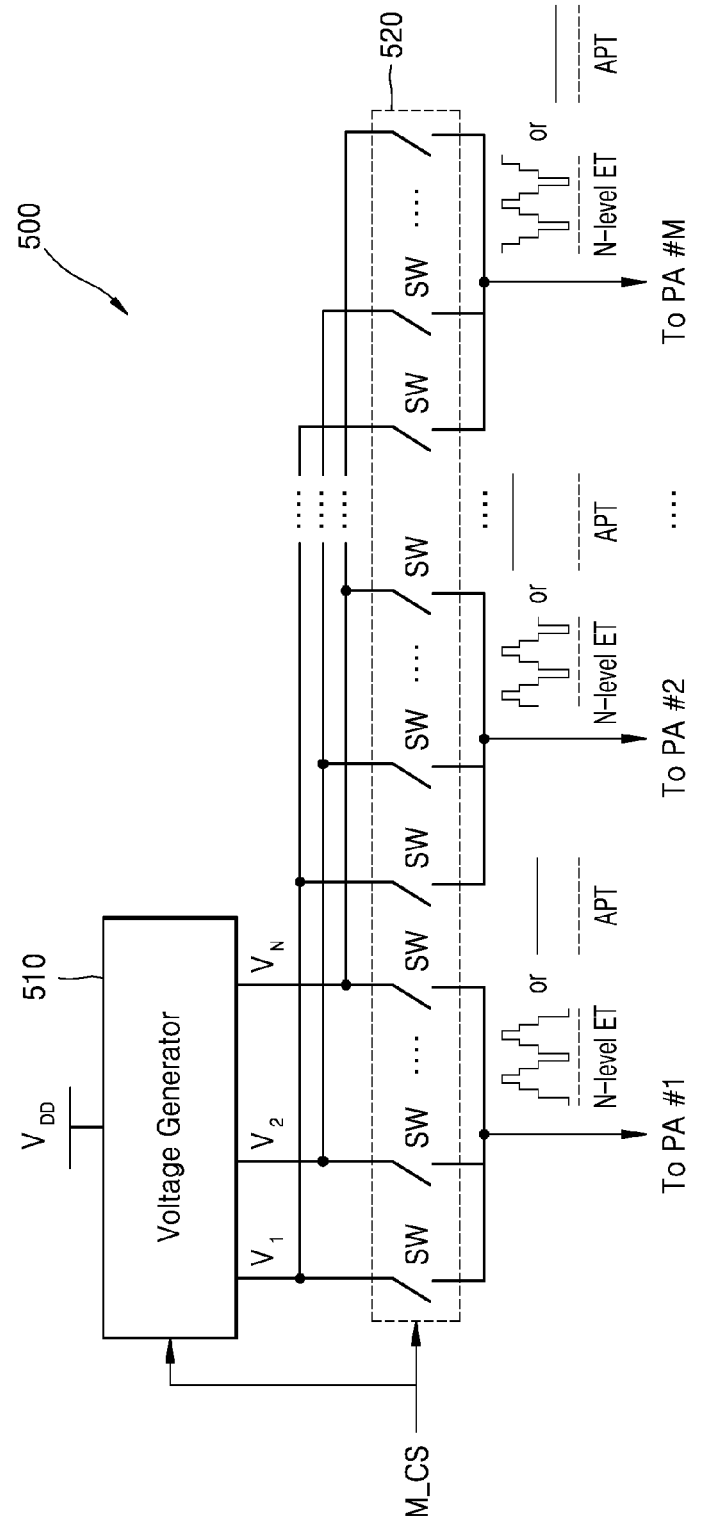
FIG. 10 is a block diagram illustrating a supply modulator providing a selection supply voltage to a plurality of power amplifiers.

FIG. 10 is a block diagram illustrating a supply modulator 500 providing a selection voltage to a plurality of power amplifiers. Referring to FIG. 10, the supply modulator 500 may include a voltage generator 510 and a switch unit 520. The voltage generator 510 may include a SIMO converter or a plurality of DC-DC converters, as described above. The voltage generator 510 may select, based on one or more modulation control signals M_CS received from the outside, at least one of a plurality of voltages having different levels, generate only a selection supply voltage and apply an N-level ET technique or APT technique to provide a variable supply voltage to a plurality of power amplifiers PA#1 through PA#M.

Figure 11:
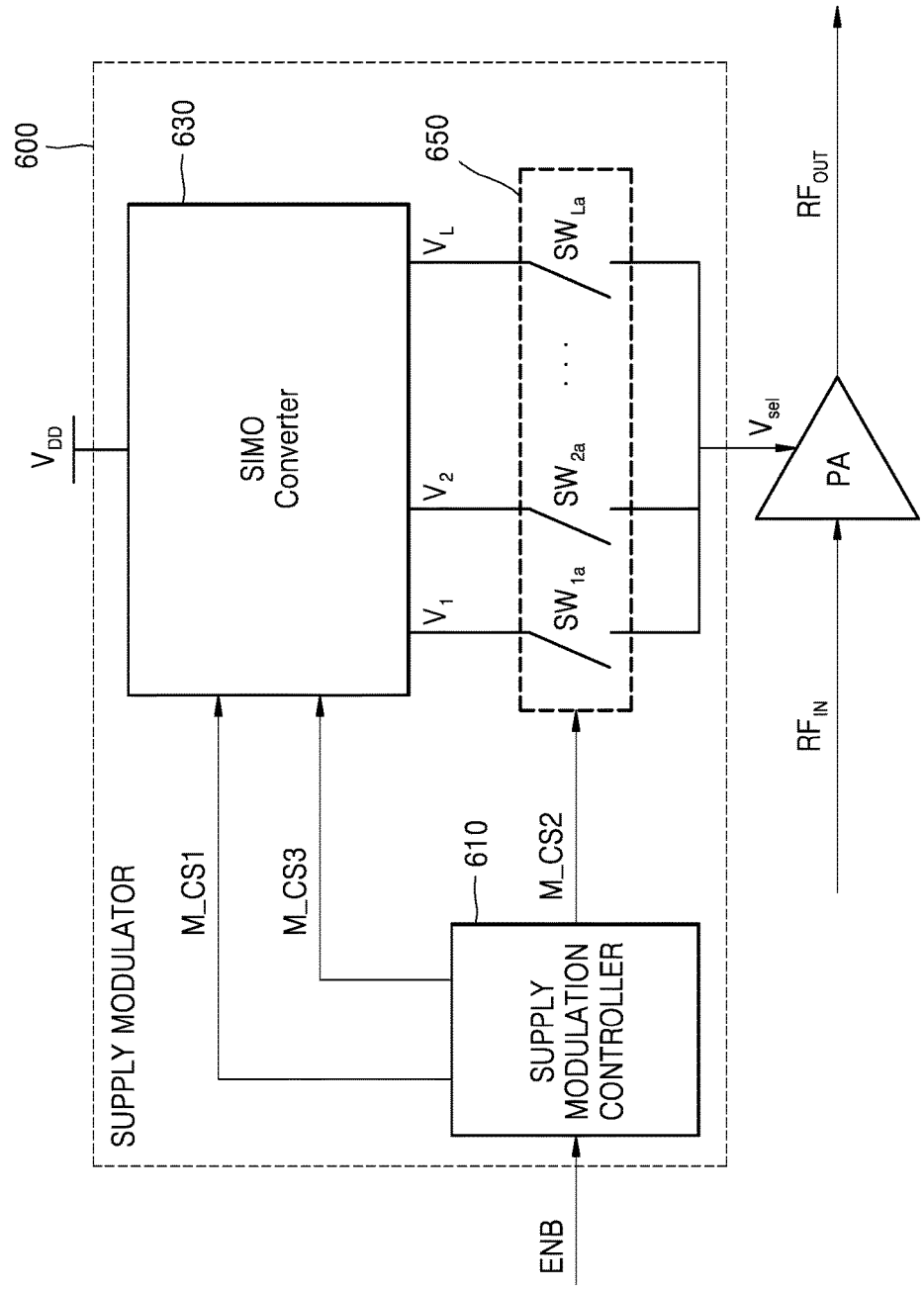
FIG. 11 is a block diagram illustrating a supply modulator including a SIMO converter supporting a Dynamic Voltage Scaling (DVS) function.

FIG. 11 is a block diagram illustrating a supply modulator 600 including a SIMO converter 630 supporting a DVS function.

Referring to FIG. 11, the supply modulator 600 may include a supply modulation controller 610, the SIMO converter 630 supporting a DVS function, and a switch unit 650. Compared with the SIMO converter 230a of FIG. 4, a plurality of voltage generation circuits of the SIMO converter 630 may generate voltages of various levels. The supply modulation controller 610 may generate a voltage modification control signal M_CS3 based on an envelope signal ENB and provide the same to the SIMO converter 630. In response to the voltage modification control signal M_CS3, a voltage generation circuit of the SIMO converter 630 may modify a level of a voltage that is generated. Compared with the SIMO converter 230a of FIG. 4, the SIMO converter 630 may include fewer voltage generation circuits but generate voltages having various levels. An operation of the supply modulator 600 will be described in more detail below.

Figure 12:
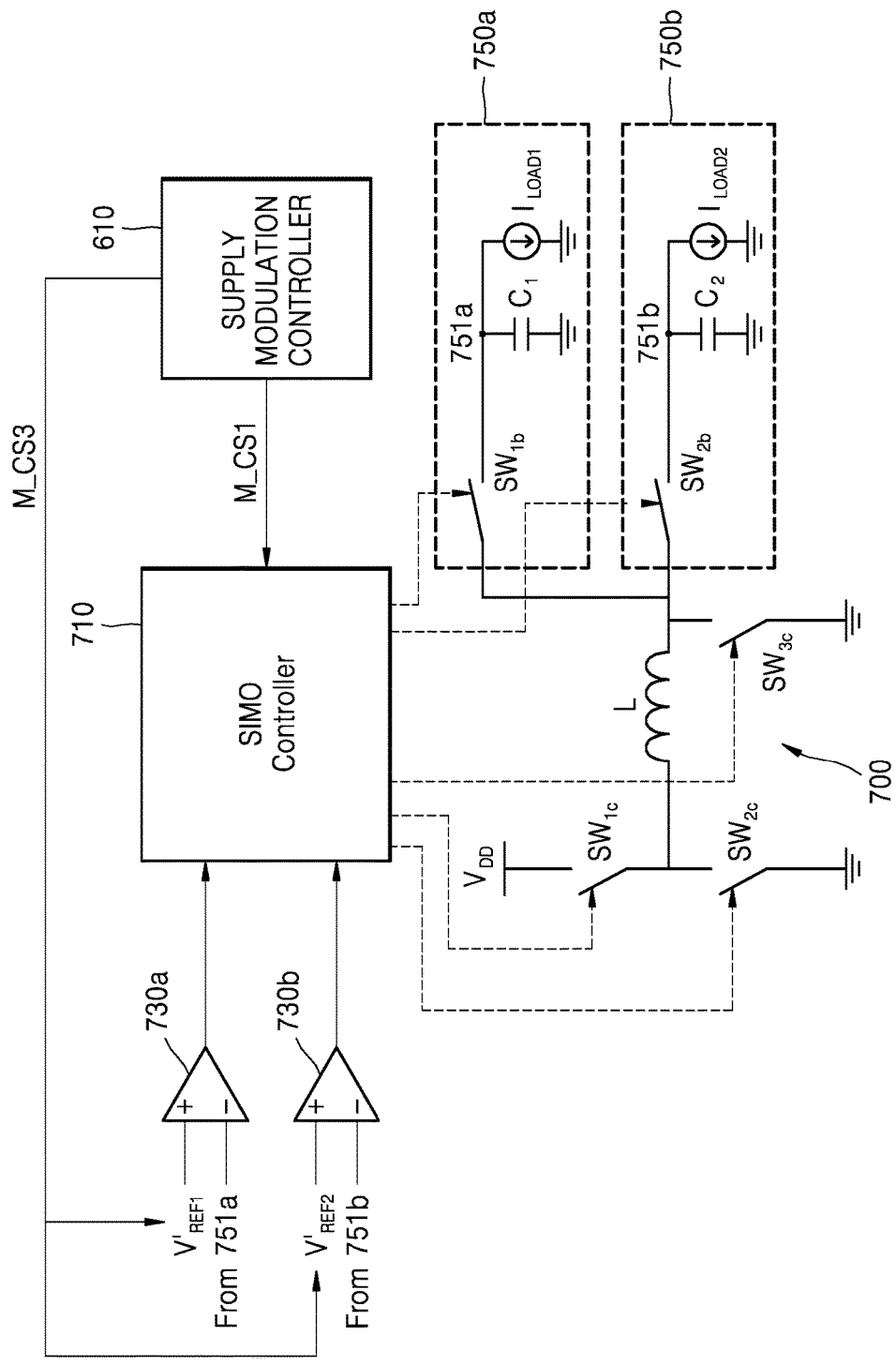
FIG. 12 is a diagram illustrating a SIMO converter that supports a DVS function and is included in a supply modulator according to another example embodiment.

FIG. 12 is a diagram illustrating a SIMO converter 700 that supports a DVS function and is included in a supply modulator according to an example embodiment.

Referring to FIG. 12, the SIMO converter 700 may include a SIMO controller 710, first and second comparators 730a and 730b, first and second voltage generation circuits 750a and 750b, an inductor L, and switch devices $SW_{1c}$, $SW_{2c}$, and $SW_{3c}$. The SIMO converter 700 may generate a plurality of voltages of different levels based on a DVS function, and output the voltages through output terminals 751a and 751b of the first and second voltage generation circuits 750a and 750b.

A supply modulation controller 610 may generate a voltage modification control signal M_CS3 based on an envelope signal, and may modify at least one among a first reference voltage $V'_{REF1}$ input to the first comparator 730a and a second reference voltage $V_{REF2}$ input to the second comparator 730b by using the voltage modification control signal M_CS3. For example, the supply modulation controller 610 may modify a first level of the first reference voltage $V'_{REF1}$ to a second level by using the voltage modification control signal M_CS3, and accordingly, the first voltage generation circuit 750a may generate a voltage of a different level from a previous one. For convenience of description, the supply modulation controller 610 is illustrated as modifying the first and second reference voltages $V'_{REF1}$ and $V'_{REF2}$, but the first and second reference voltages $V'_{REF1}$ and $V_{REF2}$ may also be modified via the SIMO controller 710. In addition, supporting a DVS function by modifying voltages generated by the voltage generation circuits 750a and 750b by modifying the first and second reference voltages $V'_{REF1}$ and $V_{REF2}$ is merely an example embodiment and is not limited thereto, and voltages generated by the voltage generation circuits 750a and 750b may be modified using various methods. Hereinafter, an operation of the supply modulator 700 will be described in detail.

Figure 13:
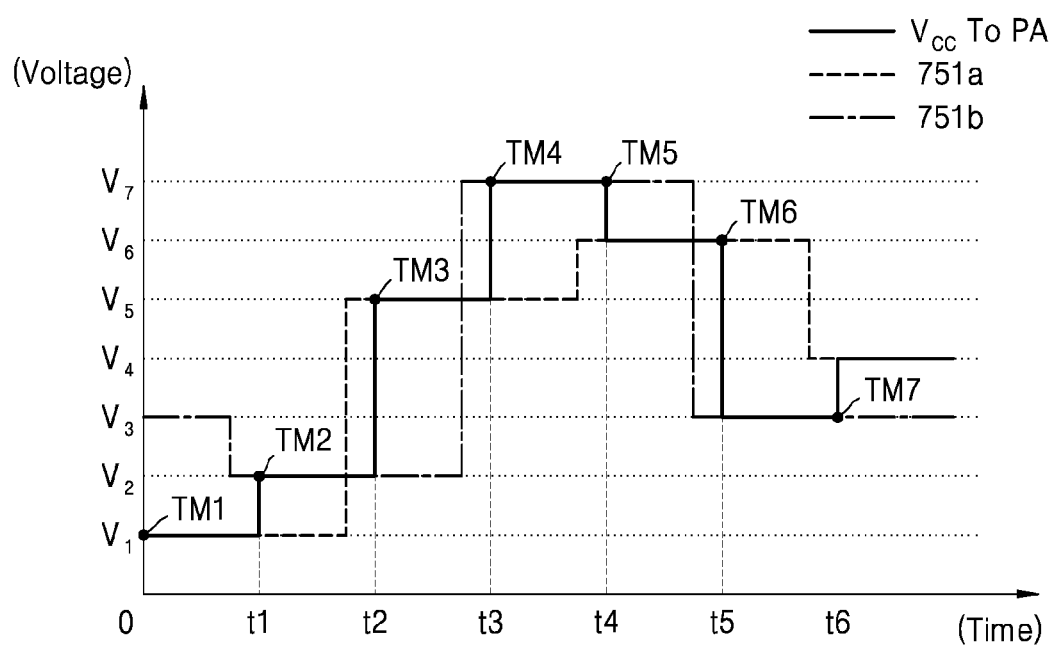
FIG. 13 is a graph for explaining an operation of the SIMO converter.

In FIG. 13, a voltage 751a output from the first voltage generation circuit 750a and a voltage 751b output from the second voltage generation circuit 750b are illustrated, and a supply voltage Vcc provided to a power amplifier through a switch unit is illustrated.

Referring to FIGS. 12 and 13, the SIMO controller 710 may select the first voltage generation circuit 750a as a first selection supply voltage circuit and select the second voltage generation circuit 750b as a second selection supply voltage circuit at a first supply voltage timing TM1 based on a selection control signal M_CS1 received from the supply modulation controller 610. The first voltage generation circuit 750a and the second voltage generation circuit 750b may be enabled. Here, a first selection supply voltage circuit may be a circuit that immediately generates a selection supply voltage at a predetermined supply voltage timing and provides the same to a power amplifier, and a second selection supply voltage circuit may be a circuit that is set to generate a selection supply voltage at a next supply voltage timing and provide the same to a power amplifier.

That is, the supply modulation controller 610 may control the first and second voltage generation circuits such that the first voltage generation circuit 750a generates a first voltage $V_1$ in a section 0-t1, and may modify a level of the second reference voltage $V_{REF2}$ related to the second voltage generation circuit 750b so that the second voltage generation circuit 750b generates a second voltage $V_2$. The supply modulation controller 610 may control the switch unit in the section 0-t1 so as to connect the first voltage generation circuit 750a and the power amplifier to each other to thereby provide the first voltage $V_1$ to the power amplifier, and may disconnect the second voltage generation circuit 750b from the power amplifier so that the second voltage $V_2$ is not provided to the power amplifier. As described above, the supply modulation controller 610 may control the second voltage generation circuit 750b in advance such that a level of a voltage generated by the second voltage generation circuit 750b is modified.

The SIMO controller 710 may select the second voltage generation circuit 750b as a first selection supply voltage circuit and the first voltage generation circuit 750a as a second selection supply voltage circuit at a second supply voltage selection timing TM2 based on the selection control signal M_CS1. That is, in a section t1-t2, the supply modulation controller 610 may control the first voltage generation circuit 750a and the second voltage generation circuit 750b such that the second voltage generation circuit 750b maintains the second voltage $V_2$, and modify a level of the first reference voltage $V'_{REF1}$ related to the first voltage generation circuit 750a so that the first voltage generation circuit 750a generates a fourth voltage $V_4$. The supply modulation controller 610 may control the switch unit in the section t1-t2 so as to connect the second voltage generation circuit 750b and the power amplifier to thereby provide the second voltage $V_2$ to the power amplifier, and may disconnect the first voltage generation circuit 750a from the power amplifier so as not to provide the fourth voltage $V_4$ to the power amplifier.

The SIMO converter 700 may operate in each of the sections t2-t3, t3-t4, t4-t5, and t5-t6 in the above-described manner, and the SIMO converter 700 may perform an envelope tracking operation as illustrated in FIG. 7A only by using the first and second voltage generation circuits 750a and 750b.

Figure 14:
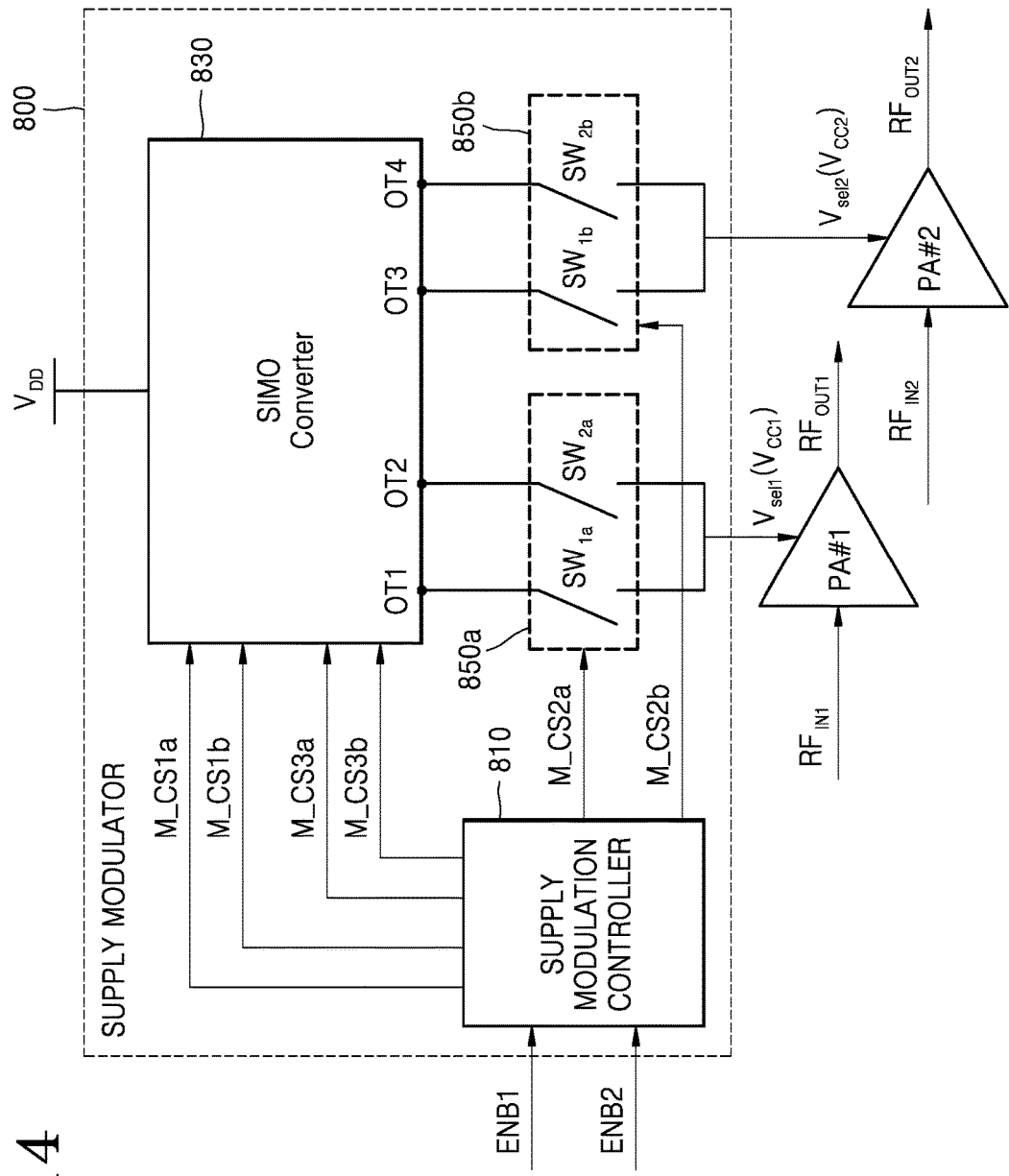
FIG. 14 is a block diagram of a supply modulator that provides a selection supply voltage to power amplifiers and supports a DVS function, according to another example embodiment.

FIG. 14 is a block diagram of a supply modulator 800 that provides a selection supply voltage to each of a plurality of power amplifiers and supports a DVS function, according to an example embodiment.

Referring to FIG. 14, the supply modulator 800 may include a supply modulation controller 810, a SIMO converter 830 supporting a DVS function, a first switch unit 850a and a second switch unit 850b. The SIMO converter 830 may also include four voltage generation circuits and respective first through fourth output terminals OT1 through OT4 of the voltage generation circuits. A supply voltage $V_{CC1}$ may be supplied to the first power amplifier PA#1 through the first and second output terminals OT1 and OT2, and a supply voltage $V_{CC2}$ may be supplied to the second power amplifier PA#2 through the third and fourth output terminals OT3 and OT4.

The supply modulation controller 810 may receive a first envelope signal ENB1 from the outside, and generate a first selection control signal M_CS1a and a first voltage modification control signal M_CS3a based on the first envelope signal ENB1 and provide the first selection control signal M_CS1a and the first voltage modification control signal M_CS3a to the SIMO converter 830, and generate a first connection control signal M_CS2a and provide the same to the first switch unit 850a. Accordingly, in response to the first selection control signal M_CS1a and the first voltage modification control signal M_CS3a, the SIMO converter 830 may generate at least one of a plurality voltages as a first selection supply voltage $V_{sell}$, and the first switch unit 450a may perform, based on the first connection control signal M_CS2a, a switching operation so as to provide the first selection supply voltage $V_{sel1}$ to the first power amplifier PA#1 as the supply voltage $V_{CC1}$. The supply modulation controller 810 may receive a second envelope signal ENB2 from the outside, and generate a second selection control signal M_CS1b and a second voltage modification control signal M_CS3b based on the second envelope signal ENB2 and provide the second selection control signal M_CS1b and the second voltage modification control signal M_CS3b to the SIMO converter 830, and generate a second connection control signal M_CS2b and provide the same to the second switch unit 850b. Accordingly, in response to the second selection control signal M_CS1b and the second voltage modification control signal M_CS3b, the SIMO converter 830 may generate at least one of a plurality voltages as a second selection supply voltage $V_{sel2}$, and the second switch unit 450b may perform, based on the second connection control signal M_CS2b, a switching operation to provide the second selection supply voltage $V_{sel2}$ to the second power amplifier PA#2 as the supply voltage $V_{cc2}$.

Figure 15:
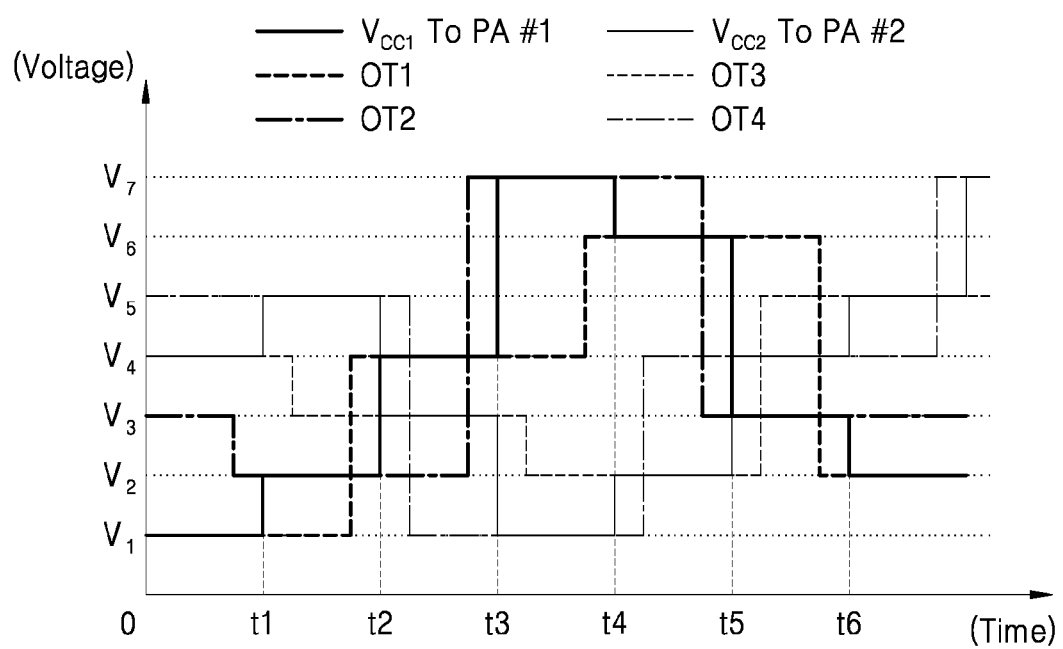
FIG. 15 is a graph illustrating a supply modulation operation of the supply modulator, according to an example embodiment.

FIG. 15 is a graph illustrating a supply modulation operation of the supply modulator 800 of FIG. 14, according to an example embodiment.

In FIG. 15, a voltage that is output through the output terminal OT1 of the first voltage generation circuit will be denoted as OT1 and a voltage output through the output terminal OT2 of the second voltage generation circuit will be denoted as OT2, and a supply voltage $V_{CC1}$ output through the first switch unit 850a is illustrated. A voltage output through the output terminal OT3 of the third voltage generation circuit will be denoted as OT3 and a voltage output through the output terminal OT4 of the fourth voltage generation circuit will be denoted as OT4, and a supply voltage $V_{CC2}$ output through the second switch unit 850b is illustrated.

As illustrated in FIGS. 14 and 15, the supply modulator 800 may individually and respectively provide the supply voltages $V_{CC1}$ and $V_{CC2}$ to the first power amplifier PA#1 and the second power amplifier PA#2 via a DVS function. A detailed operation of the supply modulator 800 is described above with reference to FIG. 13, and thus description thereof will be omitted here.

Figure 16:
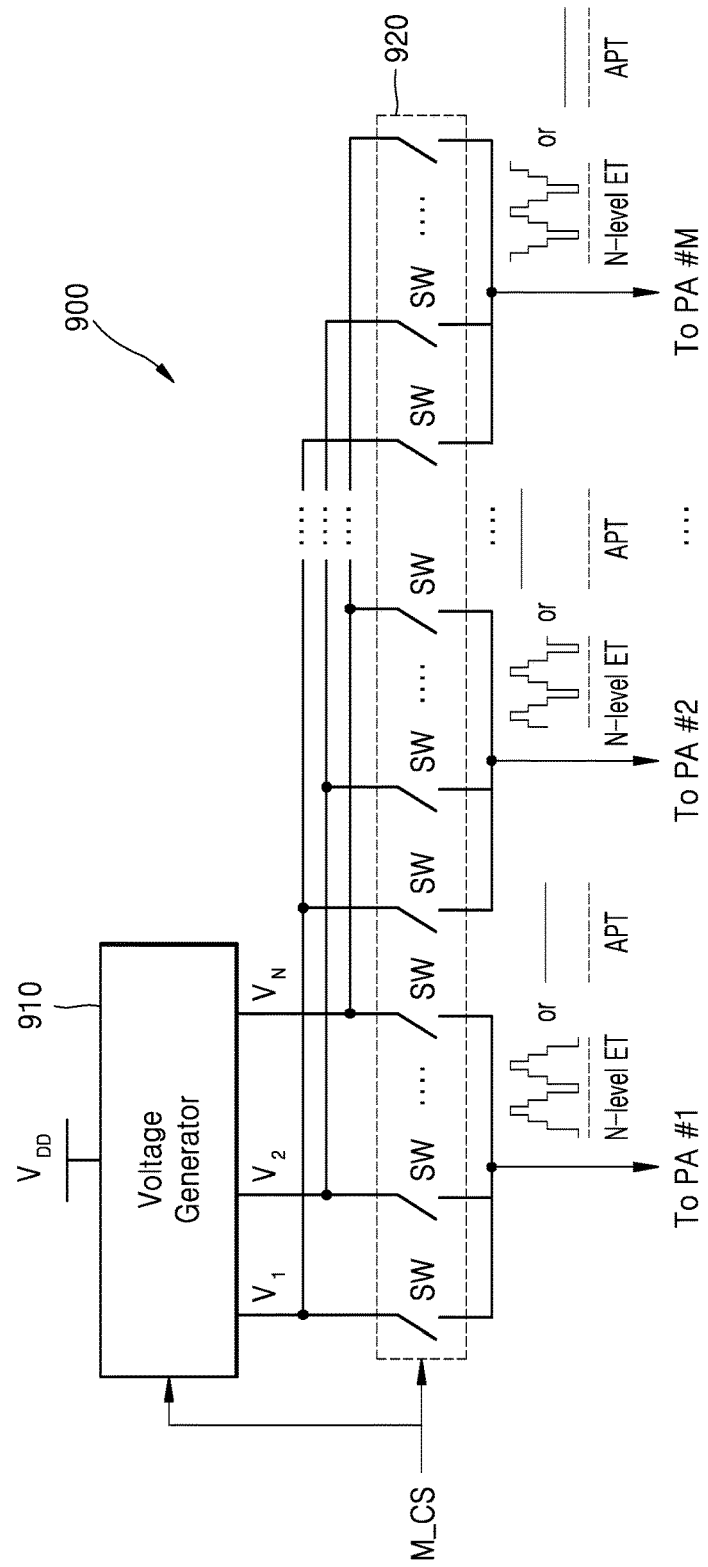
FIG. 16 is a diagram illustrating a supply modulator that provides a selection supply voltage to power amplifiers and supports a DVS function.

FIG. 16 is a diagram illustrating a SIMO converter 900 included into a supply modulator that provides a selection supply voltage to a plurality of power amplifiers and supports a DVS function.

Referring to FIG. 16, the SIMO converter 900 may include a voltage generator 910 and a switch unit 720. As described above, the voltage generator 910 may include a SIMO converter supporting a DVS function or a plurality of DC-DC converters supporting a DVS function. The voltage generator 910 may select, based on a modulation control signal M_CS received from the outside, at least one of a plurality of voltages having different levels as a selection supply voltage, and generate only the selection supply voltage and apply N-level ET technique or APT technique to provide a variable supply voltage to a plurality of power amplifiers PA#1 through PA#M.

Figure 17:
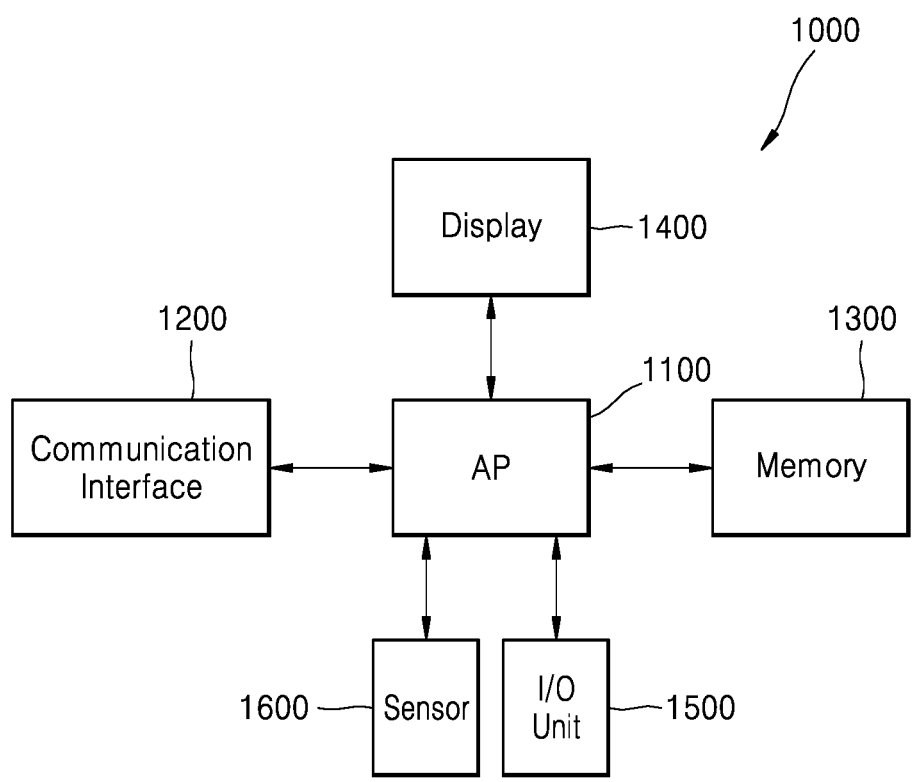
FIG. 17 is a block diagram illustrating an IoT device according to an example embodiment.

FIG. 17 is a block diagram illustrating an IoT device 1000 according to an example embodiment.

Referring to FIG. 17, the supply modulators according to the example embodiments may be included in the IoT device 1000. IoT may refer to a network between objects communicating with each other via wired or wireless communication. An IoT device may have an accessible wired or wireless interface, and may include devices that transmit and/or receive data by communicating with at least one other device through the wired or wireless interface. Examples of the accessible interface may include modem communication interfaces that are accessible to a Local Area Network (LAN), a Wireless LAN (WLAN) such as Wi-Fi, a Wireless Personal Area Network (WPAN) such as Bluetooth, a Wireless Universal Serial Bus (USB), ZigBee, Near Field Communication (NFC), Radio-frequency identification (RFID), Power Line communication (PLC), or a mobile cellular network such as 3G, 4G, or LTE. The Bluetooth interface may support Bluetooth Low Energy (BLE).

The IoT device 1000 may include a communication interface to communicate with the outside. The communication interface 1200 may be, for example, a wireless short range communication interface such as a wired LAN, Bluetooth, Wi-Fi, or ZigBee, or a modem communication interface that allows access to a mobile communication network such as PLC, 3G or LTE. The communication interface 1200 may include a transceiver and/or a receiver. The IoT device 1000 may transmit and/or receive information from an access point or a gateway through the transceiver and/or the receiver. The IoT device 1000 may communicate with a user device or other IoT devices to transmit and/or receive control information or data of the IoT device 1000.

In the present example embodiment, the transceiver included in the communication interface 1200 may include a supply modulator, and the supply modulator may be implemented based on the description provided above with reference to FIGS. 1 through 16.

The IoT device 1000 may further include a computing processor or an application processor (AP) 1100. The IoT device 1000 may further include a battery for internal power supply or a power supply unit receiving power from the outside. The IoT device 1000 may include a display 1400 displaying an internal status or data. The user may control the IoT device 1000 via a user interface (UI) of the display 1400. The IoT device 1000 may transmit an internal status and/or data through the transceiver, and receive a control command and/or data from the outside through the receiver.

The memory 1300 may store a control command code, control data or user data that controls the IoT device 1000. The memory 1300 may include at least one of a volatile memory and a non-volatile memory. The nonvolatile memory may include at least one of various memories such as read only memory (ROM), programmable ROM (PROM), Electrically Programmable ROM (EPROM), Electrically Erasable and Programmable ROM (EEPROM), a flash memory, Phase-change RAM (PRAM), Magnetic RAM (MRAM), Resistive RAM (ReRAM), and Ferroelectric RAM (FRAM). The volatile memory may include at least one of various memories such as Dynamic RAM (DRAM), Static RAM (SRAM), and Synchronous DRAM (SDRAM).

The IoT device 1000 may further include a storage device. Examples of the storage device may be nonvolatile media such as a hard disk drive (HDD), a solid state disk (SSD), an embedded multimedia card (eMMC), and a Universal Flash Storage (UFS). The storage device may store user information provided through the input/output (I/O) unit 1500 and sensing information collected using the sensor 1600.

While the inventive concept has been particularly shown and described with reference to embodiments thereof, it will be understood that various changes in form and details may be made therein without departing from the spirit and scope of the following claims.

What is claimed is:

1. A supply modulator comprising:
a supply modulation controller configured to receive a first envelope signal that follows an amplitude of a first RF input signal, to determine supply voltage select periods by dividing the first envelope signal into sections based on time, to generate a first selection control signal and a first connection control signal based on the amplitude of each of the sections, respectively, and to output the first selection control signal and the first connection control signal;
a voltage generator, which comprises a plurality of output terminals configured to respectively output voltages having different levels in each of the supply voltage select periods, and is configured to select, in response to the first selection control signal, at least one of the voltages as a first selection supply voltage and to generate the first selection supply voltage at each of the supply voltage select periods by performing DC-DC conversion on a supply voltage input from a power supply; and
a switch unit configured to connect one of the plurality of output terminals, through which the first selection supply voltage is output to a first power amplifier, in response to the first connection control signal, for a time duration of one of the supply voltage select periods,
wherein the supply modulation controller is further configured to set the time duration of each of the supply voltage select periods and a change in an amount of the first selection supply voltage provided in each of the supply voltage select periods in such a way that at least one of the time duration of the supply voltage select periods and the change in the amount of the first selection supply voltage provided in each of the supply voltage select periods is changed in response to a change of a frequency bandwidth of the first RF input signal.

2. The supply modulator of claim 1, wherein the voltage generator comprises a single inductor multiple output converter for generating the voltages of the different levels.

3. The supply modulator of claim 2, wherein the single inductor multiple output converter comprises voltage generation circuits for generating the voltages,
wherein, in response to the first selection control signal, only a voltage generation circuit configured to generate the at least one of the voltages is enabled, among the voltage generation circuits.

4. The supply modulator of claim 1, wherein the voltage generator comprises DC-DC converters configured to respectively generate the voltages of the different levels.

5. The supply modulator of claim 1, wherein the voltage generator is further configured to select at least one of the voltages as a second selection supply voltage, in response to a second selection control signal corresponding to a second envelope signal that follows the amplitude of a second RF input signal, and to generate the second selection supply voltage by performing DC-DC conversion on the supply voltage input from the power supply,
wherein the switch unit is further configured to connect, in response to a second connection control signal corresponding to the second envelope signal, one of the plurality of output terminals, through which the second selection supply voltage is output, to a second power amplifier.

6. The supply modulator of claim 5,
wherein the supply modulation controller is further configured to generate the second selection control signal and the second connection control signal based on the second envelope signal, at each of the supply voltage select periods, and to provide the second selection control signal and the second connection control signal to the voltage generator and the switch unit, respectively,
wherein the supply modulation controller is further configured to set the supply voltage select periods based on a signal having the frequency bandwidth of a greater value, among the first RF input signal and the second RF input signal.

7. The supply modulator of claim 1, wherein the sections, into which the first envelope signal is divided, follow a curve of the first envelope signal, by forming steps, a height of each of the steps corresponding to the change in the amount of the first selection supply voltage provided in each of the supply voltage select periods, respectively, and a length of each of the steps corresponding to the time duration of outputting the first selection supply voltage in the supply voltage select periods, respectively.

8. A communication device comprising:
a modem configured to generate a transmission signal and an envelope signal corresponding to the transmission signal;
a radio frequency (RF) signal generator configured to receive the transmission signal and generate an RF input signal based on the transmission signal;
a supply modulator comprising voltage generation circuits configured to respectively generate supply voltages having different levels, and being configured to receive the envelope signal that follows an amplitude of the RF input signal, to determine supply voltage select periods by dividing the envelope signal into sections based on time, to select a first selection voltage generation circuit, from the voltage generation circuits, based on the envelope signal at a first supply voltage selection timing, among the supply voltage select periods, and to generate a first supply voltage, among the supply voltages, by using the first selection voltage generation circuit; and
a power amplifier configured to generate an RF output signal by amplifying the RF input signal based on the first supply voltage,
wherein the supply modulator is further configured to set a time duration of each of the supply voltage select periods and a change in an amount of the first supply voltage provided in each of the supply voltage select periods in such a way that at least one of the time duration of the supply voltage select periods and the change in the amount of the first supply voltage provided in each of the supply voltage select periods is changed, respectively, in response to a change of a frequency bandwidth of the RF input signal.

9. The communication device of claim 8, wherein the supply modulator is further configured to select a second selection voltage generation circuit, from the voltage generation circuits, based on the envelope signal at the first supply voltage selection timing, and to generate a second supply voltage, among the supply voltages, by using the second selection voltage generation circuit based on a voltage modification signal.

10. The communication device of claim 9, wherein the supply modulator comprises:

a switch unit configured to selectively connect the voltage generation circuits, respectively, to the power amplifier; and a supply modulation controller configured to control the switch unit based on the envelope signal such that the first selection voltage generation circuit is connected to the power amplifier and the second selection voltage generation circuit is disconnected from the power amplifier, at the first supply voltage selection timing.

11. The communication device of claim 10, wherein the supply modulation controller is further configured to enable the first selection voltage generation circuit and the second selection voltage generation circuit.

12. The communication device of claim 10, wherein the supply modulation controller is further configured to control the switch unit at a second supply voltage selection timing that follows in time the first supply voltage selection timing, such that the second selection voltage generation circuit is connected to the power amplifier and the first selection voltage generation circuit is disconnected from the power amplifier, and the power amplifier is further configured to generate, at the second supply voltage selection timing, the RF output signal by amplifying the RF input signal by using the second supply voltage generated by the second selection voltage generation circuit at the first supply voltage selection timing.

13. A supply modulator comprising:
a supply modulation controller configured to receive an envelope signal that follows an amplitude of an RF input signal, and to determine supply voltage select periods by dividing the envelope signal into sections based on time;
a voltage generator comprising:
voltage generation circuits, each of the voltage generation circuits being configured to generate supply voltages having different levels in each of the supply voltage select periods, and
output terminals, each of the output terminals being connected to a certain voltage generation circuit, among the voltage generation circuits, to output the supply voltages, respectively; and
a switch unit comprising switches, each of the switches being configured to connect a power amplifier to one of output terminals, and to provide, to the power amplifier, one of the supply voltages from the certain voltage generation circuit in correspondence to the envelope signal, for a time duration of one of the supply voltage select periods, wherein the supply modulation controller is further configured to set the time duration of each of the supply voltage select periods and a change in an amount of the supply voltages provided in each of the supply voltage select periods in such a way that at least one of the time duration of the supply voltage select periods and the change in the amount of the supply voltages provided in each of the supply voltage select periods is changed in response to a change of a frequency bandwidth of the RF input signal.

14. The supply modulator of claim 13, wherein the voltage generator is configured to sequentially receive selection control signals corresponding to the sections of the envelope signal, to select the voltage generation circuits based on the selection control signals, respectively, and to generate, in turn, the supply voltages by using the voltage generation circuits that were selected, and the switch unit is configured to sequentially receive connection control signals in correspondence with the selection control signals, and to connect each of the output terminals through which the one of the supply voltages is to be output to a corresponding switch.

15. The supply modulator of claim 14, wherein the voltage generator is further configured to enable only the certain voltage generation circuit configured to generate the one of the supply voltages based on one of the selection control signals.

16. The supply modulator of claim 14,
wherein the supply modulation controller is further configured to generate the selection control signals and the connection control signals at each supply voltage select timing, and to sequentially provide the selection control signals and the connection control signals to the voltage generator and the switch unit, respectively.

17. The supply modulator of claim 14, wherein the switch unit comprises a first switch unit and a second switch unit,
the power amplifier comprises a first power amplifier and a second power amplifier,
the first switch unit is configured to connect the first power amplifier to a first switch of the first switch unit to provide a first generated supply voltage to amplify the RF input signal, and
the second switch unit is configured to connect the second power amplifier to a second switch of the second switch unit to provide a second supply voltage to amplify a different RF input signal.

* * * * *